United States Patent
Makino et al.

(10) Patent No.: US 7,853,113 B2
(45) Date of Patent: Dec. 14, 2010

(54) RESIN COMPOSITION FOR OPTICAL MATERIAL, RESIN FILM FOR OPTICAL MATERIAL, AND OPTICAL WAVEGUIDE

(75) Inventors: Tatsuya Makino, Ibaraki (JP); Toshihiko Takasaki, Ibaraki (JP); Atsushi Takahashi, Ibaraki (JP)

(73) Assignee: Hitachi Chemical Company, Ltd., Tokyo (JP)

(*) Notice: Subject to any disclaimer, the term of this patent is extended or adjusted under 35 U.S.C. 154(b) by 0 days.

(21) Appl. No.: 12/776,676

(22) Filed: May 10, 2010

(65) Prior Publication Data

US 2010/0221668 A1   Sep. 2, 2010

Related U.S. Application Data

(62) Division of application No. 12/089,546, filed as application No. PCT/JP2007/064435 on Jul. 23, 2007, now Pat. No. 7,747,129.

(30) Foreign Application Priority Data

Jul. 25, 2006 (JP) ............................. 2006-201902
Oct. 11, 2006 (JP) ............................. 2006-277459

(51) Int. Cl.
   *G02B 6/00* (2006.01)
(52) U.S. Cl. ..................................... 385/141; 264/1.24
(58) Field of Classification Search ................. 385/141; 526/329.7
   See application file for complete search history.

(56) References Cited

U.S. PATENT DOCUMENTS

| 4,696,978 | A | | 9/1987 | Dean | |
| 4,826,937 | A | * | 5/1989 | Dean | 526/262 |
| 5,155,190 | A | * | 10/1992 | Okinaka et al. | 526/203 |
| 5,183,856 | A | * | 2/1993 | Kitagawa et al. | 525/282 |
| 5,405,670 | A | | 4/1995 | Wetzel et al. | |

(Continued)

FOREIGN PATENT DOCUMENTS

JP   06-258537   9/1994

(Continued)

OTHER PUBLICATIONS

European Search Report dated Aug. 13, 2010, including the Supplementary European Search Report and European Search Opinion, for EP Application No. 07791167.5-2109/2045629 PCT/JP2007064435.

*Primary Examiner*—Charlie Peng
(74) *Attorney, Agent, or Firm*—Antonelli, Terry, Stout & Kraus, LLP.

(57) ABSTRACT

A resin composition for an optical material, which is excellent in heat resistance and transparency and is soluble in an aqueous alkali solution, a resin film for an optical material made of the resin composition, and an optical waveguide using the same are provided. The resin composition for an optical material includes: (A) an alkali-soluble (meth)acrylate polymer containing a maleimide skeleton in a main chain; (B) a polymerizable compound; and (C) a polymerization initiator. The resin film for an optical material is made of the resin composition for an optical material. The optical waveguide has a core part and/or a clad layer formed using the resin composition for an optical material or the resin film for an optical material.

4 Claims, 1 Drawing Sheet

U.S. PATENT DOCUMENTS

| | | | |
|---|---|---|---|
| 5,425,122 A * | 6/1995 | Matsumura et al. | 385/124 |
| 6,120,973 A | 9/2000 | Itano et al. | |
| 2005/0074563 A1 | 4/2005 | Tatsuzawa et al. | |

FOREIGN PATENT DOCUMENTS

| | | |
|---|---|---|
| JP | 2001233919 | 8/2001 |
| JP | 2003-195079 | 7/2003 |
| JP | 2003-292573 | 10/2003 |
| JP | 2004-002846 | 1/2004 |
| JP | 2004-315752 | 11/2004 |
| JP | 2005-221584 | 8/2005 |
| WO | WO2006038691 | 4/2006 |

* cited by examiner

RESIN COMPOSITION FOR OPTICAL MATERIAL, RESIN FILM FOR OPTICAL MATERIAL, AND OPTICAL WAVEGUIDE

This application is a Divisional application of application Ser. No. 12/089,546, filed Apr. 8, 2008 now U.S. Pat. No.7, 747,129, which is a National Stage application filed under 35 USC 371, of International (PCT) Application No. PCT/JP2007/064435, filed Jul. 23, 2007. The contents of No. 12/089,546 are incorporated herein by reference in their entirety.

TECHNICAL FIELD

The present invention relates to a resin composition for an optical material, a resin film for an optical material, and an optical waveguide using the same. In particular, the present invention relates to an optical resin composition having excellent heat resistance and transparency and is soluble in an aqueous alkaline solution, a resin film for an optical material made of the optical resin composition, and an optical waveguide using the same.

BACKGROUND ART

In recent years, in a high-speed and high-density signal transmission between electronic devices or between wiring boards, the conventional transmission through electric wirings has began to reveal limitations in realization of high speed and high density, because mutual interference and signal attenuation constitute barriers. In order to overcome such limitations, a technology for connecting between the electronic devices or between the wiring boards by light, a so-called optical interconnection, is being examined. A polymer optical waveguide has drawn attention as an optical transmission path because of being easily processed with low costs, greater wiring-flexibility, and high density.

As the modes of a polymer optical wave waveguide, it is considered that a type which is formed on a glass epoxy resin substrate on an assumption of being applied onto a photoelectric consolidated substrate or a flexible type having no hard supporting substrate supposed to make a connection between boards are preferred.

The polymer optical waveguide is also required to have high heat resistance in addition to have high transparency (low optical transmission loss) in terms of usage environment of an applicable apparatus, part implementation thereof, or the like. Known materials for the optical wave guide include (meth)acrylate polymers (see, for example Patent Documents 1 and 2).

However, even the (meth)acrylate polymers described in those patent documents have a high transparency of 0.3 dB/cm at a wavelength of 850 nm, evaluation of heat resistance performance, for example, specific test results such as optical transmission loss after a solder-reflow test are not described in detail and thus unclear.

Patent Document 1: JP Hei 06-258537 A

Patent Document 2: JP 2003-195079 A

DISCLOSURE OF THE INVENTION

Problems to be Solved by the Invention

The present invention has been made for solving the above-mentioned problems and aims to provide a resin composition for an optical material having excellent heat resistance and transparency, and is soluble in an aqueous alkaline solution, a resin film for an optical material made of the resin composition, and an optical waveguide using the same.

Means for Solving the Problems

The inventors of the present invention have intensively studied, and as a result, they have found that the above-mentioned problems can be solved by producing: a resin composition for an optical material including an alkali-soluble (meth)acrylate polymer having a maleimide skeleton in a main chain as a component (A) and also including a combination of (B) a polymerizable compound and (c) a polymerization initiator; and an optical waveguide using a resin film for an optical material made of the resin composition.

That is, the present invention provides a resin composition for an optical material including: (A) an alkali-soluble (meta) acrylate polymer containing a maleimide skeleton in a main chain; (B) a polymerizable compound; and (C) a polymerization initiator, a resin film for an optical material made of the resin composition for an optical material, and an optical waveguide in which at least one of a lower clad layer, a core part, and an upper clad layer is formed using the resin composition for an optical material or the resin film for an optical material.

Here, the (meth)acrylate polymers mean acrylate polymers and/or (meth)acrylate polymers.

Effect of the Invention

The resin composition for an optical material and the resin film for an optical material made of the resin composition in accordance with the present invention are soluble in an aqueous alkali solution. The optical waveguide produced using the same is excellent in heat resistance and transparency.

Figure 1:
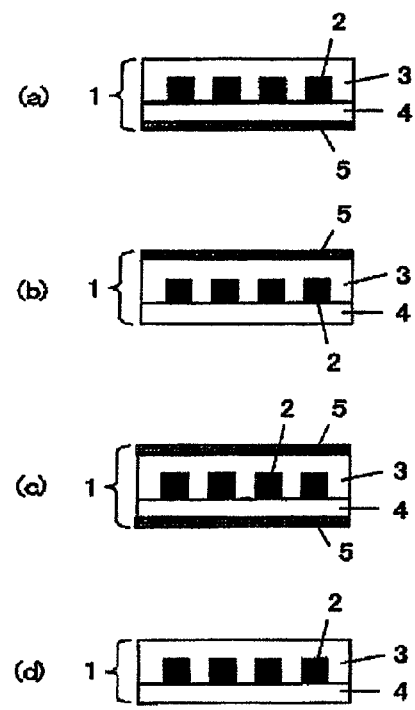
FIG. 1 is a cross sectional diagram illustrating a configuration of an optical waveguide.

DESCRIPTION OF SYMBOLS 1 optical waveguide
2 core part
3 lower clad layer
4 upper clad layer
5 substrate

BEST MODE FOR CARRYING OUT THE INVENTION

The resin composition for an optical material of the present invention preferably be a resin composition to be hardened by heating or irradiation with an active light beam. The resin composition preferably includes (A) an alkali-soluble (meth) acrylate polymer having a maleimide skeleton in a main chain, (B) a polymerizable compound, and (C) a polymerization initiator.

Hereinafter, the component (A) used in the present invention will be described.

The component (A), an alkali-soluble (meth)acrylate polymer having a maleimide skeleton in a main chain is not specifically limited as long as it can be dissolved in a developing solution made of an aqueous alkali solution and imparted with solubility enough to carry out a desired developing process. In terms of transparency, heat resistance, and solubility to an aqueous alkali solution, an alkali-soluble (meth)acrylate polymer is preferably used, the polymer including in the main chain repeating units (A-1) and (A-2) respectively represented by the following general formulae (1) and (2) and at least one of repeating units (A-3) and (A-4) respectively represented by the following general formulae (3) and (4).

[Chem 1]

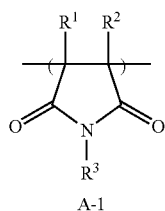
(1)

A-1 where $R^1$ to $R^3$ each independently represent any of a hydrogen atom and an organic group having 1 to 20 carbon atoms,

[Chem 2]

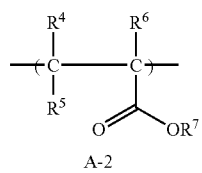
(2)

A-2 where $R^4$ to $R^6$ each independently represent any of a hydrogen atom and an organic group having 1 to 20 carbon atoms, and $R^7$ represents an organic group having 1 to 20 carbon atoms,

[Chem 3]

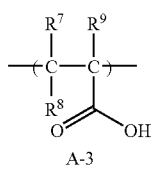
(3)

A-3 where $R^7$ to $R^9$ each independently represent any of a hydrogen atom and an organic group having 1 to 20 carbon atoms,

[Chem 4]

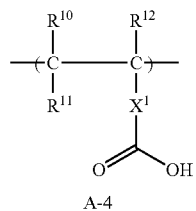
(4)

A-4 where $R^{10}$ to $R^{12}$ and $X^1$ each independently represent any of a hydrogen atom and an organic group having 1 to 20 carbon atoms.

The organic groups represented by the general formulae (1) to (4) include, for example, monovalent or divalent groups, such as an alkyl group, a cycloalkyl group, an aryl group, an aralkyl group, a carbonyl group, an alkoxycarbonyl group, an aryloxy carbonyl group, and a carbamoyl group, which may be substituted with a hydroxyl group, a halogen atom, an alkyl group, a cycloalkyl group, an aryl group, an aralkyl group, a carbonyl group, an alkoxycarbonyl group, an aryloxy carbonyl group, a carbamoyl group alkoxy group, an aryloxy group, an alkylthio group, an arylthio group, an amino group, a silyl group, or the like.

In the alkali-soluble (meth)acrylate polymer having a maleimide skeleton in the main chain of the component (A), the content of the repeating unit (A-1) derived from maleimide preferably fall in the range of 3 to 50 mass %. If it is 3 mass % or more, heat resistance derived from maleimide can be obtained. If it is 50 mass % or less, sufficient transparency can be attained and a resulting resin pattern can be not fragile. In term of those facts, it is more preferably in the range of 5 to 40 mass %, particularly preferably in the range of 10 to 30 mass %.

The structure of the repeating unit (A-1) derived from maleimide is not specifically limited as long as it is represented by the general formula (1).

Examples of the maleimide serving as a raw material for the repeating unit (A-1) include: alkylmaleimides such as N-methylmaleimide, N-ethylmaleimide, N-propylmaleimide, N-isopropylmaleimide, N-butylmaleimide, N-isobutylmaleimide, N-2-methyl-2-propylmaleimide, N-pentylmaleimide, N-2-pentylmaleimide, N-3-pentylmaleimide, N-2-methyl-1-butylmaleimide, N-2-methyl-2-butylmaleimide, N-3-methyl-1-butylmaleimide, N-3-methyl-2-butylmaleimide, N-hexylmaleimide, N-2-hexylmaleimide, N-3-hexylmaleimide, N-2-methyl-1-pentylmaleimide, N-2-methyl-2-pentylmaleimide, N-2-methyl-3-pentylmaleimide, N-3-methyl-1-pentylmaleimide, N-3-methyl-2-pentylmaleimide, N-3-methyl-3-pentylmaleimide, N-4-methyl-1-pentylmaleimide, N-4-methyl-2-pentylmaleimide, N-2,2-dimethyl-1-butylmaleimide, N-3,3-dimethyl-1-butylmaleimide, N-3,3-dimethyl-2-butylmaleimide, N-2,3-dimethyl-1-butylmaleimide, N-2,3-dimethyl-2-butylmaleimide, N-hydroxymethylmaleimide, N-1-hydroxyethylmaleimide, N-2-hydroxyethylmaleimide, N-1-hydroxy-1-propylmaleimide, N-2-hydroxy-1-propylmaleimide, N-3-hydroxy-1-propylmaleimide, N-1-hydroxy-2-propylmaleimide, N-2-hydroxy-2-propylmaleimide, N-1-hydroxy-1-butylmaleimide, N-2-hydroxy-1-butylmaleimide, N-3-hydroxy-1-butylmaleimide, N-4-hydroxy-1-butylmaleimide, N-1-hydroxy-2-butylmaleimide, N-2-hydroxy-2-butylmaleimide, N-3-hydroxy-2-butylmaleimide, N-4-hydroxy-2-butylmaleimide, N-2-methyl-3-hydroxy-1-propylmaleimide, N-2-methyl-3-hydroxy-2-propylmaleimide, N-2-methyl-2-hydroxy-1-propylmaleimide, N-1-hydroxy-1-pentylmaleimide, N-2-hydroxy-1-pentylmaleimide, N-3-hydroxy-1-pentylmaleimide, N-4-hydroxy-1-pentylmaleimide, N-5-hydroxy-1-pentylmaleimide, N-1-hydroxy-2-pentylmaleimide, N-2-hydroxy-2-pentylmaleimide, N-3-hydroxy-2-pentylmaleimide, N-4-hydroxy-2-pentylmaleimide, N-5-hydroxy-2-pentylmaleimide, N-1-hydroxy-3-pentylmaleimide, N-2-hydroxy-3-pentylmaleimide, N-3-hydroxy-3-pentylmaleimide, N-1-hydroxy-2-methyl-1-butylmeleimide, N-1-hydroxy-2-methyl-2-butylmeleimide, N-1-hydroxy-2-methyl-3-butylmeleimide, N-1-hydroxy-2-methyl-4-butylmeleimide, N-2-hydroxy-2-methyl-1-butylmeleimide, N-2-hydroxy-2-methyl-3-butylmeleimide, N-2-hydroxy-2-methyl-4-butylmeleimide, N-2-hydroxy-3-methyl-1-butylmeleimide, N-2-hydroxy-3-methyl-2-butylmeleimide, N-2-hydroxy-3-methyl-3-butylmeleimide, N-2-hydroxy-3-methyl-4-butylmeleimide, N-4-hydroxy-2-methyl-1-butylmeleimide, N-4-hydroxy-2-methyl-2-butylmeleimide, N-1-hydroxy-3-methyl-2-butylmeleimide, N-1-hydroxy-3-methyl-1-butylmeleimide, N-1-hydroxy-2,2-dimethyl-1-propylmaleimide, N-3-hydroxy-2,2-dimethyl-1-propylmaleimide, N-1-hydroxy-1-hexylmaleimide, N-1-hydroxy-2-hexylmaleimide, N-1-hydroxy-3-hexylmaleimide, N-1-hydroxy-4-hexylmaleimide, N-1-hydroxy-5-hexylmaleimide, N-1-hydroxy-6-hexylmaleimide, N-2-hydroxy-1-hexylmaleimide, N-2-hydroxy-2-hexylmaleimide, N-2-hydroxy-3-hexylmaleimide, N-2-hydroxy-4-hexylmaleimide, N-2-hydroxy-5-hexylmaleimide, N-2-hydroxy-6-hexylmaleimide, N-3-hydroxy-1-hexylmaleimide, N-3-hydroxy-2-hexylmaleimide, N-3-hydroxy-3-hexylmaleimide, N-3-hydroxy-4-hexylmaleimide, N-3-hydroxy-5-hexylmaleimide, N-3-hydroxy-6-hexylmaleimide, N-1-hydroxy-2-methyl-1-pentylmaleimide, N-1-hydroxy-2-methyl-2-pentylmaleimide, N-1-hydroxy-2-methyl-3-pentylmaleimide, N-1-hydroxy-2-methyl-4-pentylmaleimide, N-1-hydroxy-2-methyl-5-pentylmaleimide, N-2-hydroxy-2-methyl-1-pentylmaleimide, N-2-hydroxy-2-methyl-2-pentylmaleimide, N-2-hydroxy-2-methyl-3-pentylmaleimide, N-2-hydroxy-2-methyl-4-pentylmaleimide, N-2-hydroxy-2-methyl-5-pentylmaleimide, N-2-hydroxy-3-methyl-1-pentylmaleimide, N-2-hydroxy-3-methyl-2-pentylmaleimide, N-2-hydroxy-3-methyl-3-pentylmaleimide, N-2-hydroxy-3-methyl-4-pentylmaleimide, N-2-hydroxy-3-methyl-5-pentylmaleimide, N-2-hydroxy-4-methyl-1-pentylmaleimide, N-2-hydroxy-4-methyl-2-pentylmaleimide, N-2-hydroxy-4-methyl-3-pentylmaleimide, N-2-hydroxy-4-methyl-4-pentylmaleimide, N-2-hydroxy-4-methyl-5-pentylmaleimide, N-3-hydroxy-2-methyl-1-pentylmaleimide, N-3-hydroxy-2-methyl-2-pentylmaleimide, N-3-hydroxy-2-methyl-3-pentylmaleimide, N-3-hydroxy-2-methyl-4-pentylmaleimide, N-3-hydroxy-2-methyl-5-pentylmaleimide, N-1-hydroxy-4-methyl-1-pentylmaleimide, N-1-hydroxy-4-methyl-2-pentylmaleimide, N-1-hydroxy-4-methyl-3-pentylmaleimide, N-1-hydroxy-3-methyl-1-pentylmaleimide, N-1-hydroxy-3-methyl-2-pentylmaleimide, N-1-hydroxy-3-methyl-3-pentylmaleimide, N-1-hydroxy-3-methyl-4-pentylmaleimide, N-1-hydroxy-3-methyl-5-pentylmaleimide, N-3-hydroxy-3-methyl-1-pentylmaleimide, N-3-hydroxy-3-methyl-2-pentylmaleimide, N-1-hydroxy-3-ethyl-4-butylmaleimide, N-2-hydroxy-3-ethyl-4-butylmaleimide, N-2-hydroxy-2-ethyl-1-butylmaleimide, N-4-hydroxy-3-ethyl-1-butylmaleimide, N-4-hydroxy-3-ethyl-2-butylmaleimide, N-4-hydroxy-3-ethyl-3-butylmaleimide, N-4-hydroxy-3-ethyl-4-butylmaleimide, N-1-hydroxy-2,3-dimethyl-1-butylmaleimide, N-1-hydroxy-2,3-dimethyl-2-butylmaleimide, N-1-hydroxy-2,3-dimethyl-3-butylmaleimide, N-1-hydroxy-2,3-dimethyl-4-butylmaleimide, N-2-hydroxy-2,3-dimethyl-1-butylmaleimide, N-2-hydroxy-2,3-dimethyl-3-butylmaleimide, N-2-hydroxy-2,3-dimethyl-4-butylmaleimide, N-1-hydroxy-2,2-dimethyl-1-butylmaleimide, N-1-hydroxy-2,2-dimethyl-3-butylmaleimide, N-1-hydroxy-2,2-dimethyl-4-butylmaleimide, N-2-hydroxy-3,3-dimethyl-1-butylmaleimide, N-2-hydroxy-3,3-dimethyl-2-butylmaleimide, N-2-hydroxy-3,3-dimethyl-4-butylmaleimide, N-1-hydroxy-3,3-dimethyl-1-butylmaleimide, N-1-hydroxy-3,3-dimethyl-2-butylmaleimide, and N-1-hydroxy-3,3-dimethyl-4-butylmaleimide; cycloalkylmaleimides such as N-cyclopropylmaleimide, N-cyclobutylmaleimide, N-cyclopentylmaleimide, N-cyclohexylmaleimide, N-cycloheptylmaleimide, N-cyclooctylmaleimide, N-2-methylcyclohexylmaleimide, N-2-ethylcyclohexylmaleimide, and N-2-chlorocyclohexylmaleimide; and arylmaleimides such as N-phenylmaleimide, N-2-methylphenylmaleimide, N-2-ethylphenylmaleimide, and N-2-chlorophenylmaleimide.

Of those, a cycloalkylmaleimide is preferably used, and N-cyclohexylmaleimide and N-2-methylcyclohexylmaleimide are more preferably used from the viewpoint of the transparency and solubility.

Those compounds may be used alone or in combination of two or more.

In the alkali-soluble (meth)acrylate polymer having a maleimide skeleton in the main chain of the component (A), the content of the repeating unit (A-2) derived from (meth) acrylate is preferably in the range of 20 to 90 mass %. If it is 20 mass % or more, transparency derived from (meth)acrylate can be obtained. If it is 90 mass % or less, sufficient heat resistance can be attained. From the above viewpoint, a range of 25 to 85 mass % is more preferred and a range of 30 to 80 mass % is particularly preferred.

The structure of the repeating unit (A-2) derived from (meth) acrylate is not specifically limited as long as it is represented by the general formula (2).

Examples of the (meth)acrylate serving as a raw material for the repeating unit (A-2) include: aliphatic (meth)acrylates such as methyl(meth)acrylate, ethyl(meth)acrylate, butyl (meth)acrylate, isobutyl(meth)acrylate, tert-butyl(meth) acrylate, butoxyethyl(meth)acrylate, isoamyl(meth)acrylate, hexyl(meth)acrylate, 2-ethylhexyl(meth)acrylate, heptyl (meth)acrylate, octylheptyl(meth)acrylate, nonyl(meth)acrylate, decyl(meth)acrylate, undecyl(meth)acrylate, lauryl (meth)acrylate, tridecyl(meth)acrylate, tetradecyl(meth) acrylate, pentadecyl(meth)acrylate, hexadecyl(meth) acrylate, stearyl(meth)acrylate, behenyl(meth)acrylate, 2-hydroxyethyl(meth)acrylate, 2-hydroxypropyl(meth)acrylate, 3-chloro-2-hydroxypropyl(meth)acrylate, 2-hydroxybutyl(meth)acrylate, methoxypolyethyleneglycol (meth) acrylate, ethoxypolyethyleneglycol (meth)acrylate, methoxypolypropyleneglycol (meth)acrylate, ethoxypolypropyleneglycol (meth)acrylate, and mono(2-(meth) acryloyloxyethyl)succinate; alicyclic (meth)acrylates such as cyclopentyl(meth)acrylate, cyclohexyl(meth)acrylate, dicyclopentanyl(meth)acrylate, dicyclopentenyl(meth)acrylate, isobornyl(meth)acrylate, mono(2-(meth)acryloyloxyethyl) tetrahydrophthalate, and mono(2-(meth)acryloyloxyethyl) hexahydrophthalate; aromatic (meth)acrylates such as benzyl (meth)acrylate, phenyl(meth)acrylate, o-biphenyl(meth) acrylate, 1-naphthyl(meth)acrylate, 2-naphthyl(meth) acrylate, phenoxyethyl(meth)acrylate, p-cumylphenoxyethyl(meth)acrylate, o-phenylphenoxyethyl (meth)acrylate, 1-naphthoxyethyl(meth)acrylate, 2-naphthoxyethyl(meth)acrylate, phenoxypolyethyleneglycol (meth)acrylate, nonylphenoxypolyethyleneglycol (meth) acrylate, pehnoxypolypropyleneglycol (meth)acrylate, 2-hydroxy-3-phenyoxypropyl (meth)acrylate, 2-hydroxy-3-(o-phenylphenoxy)propyl (meth)acrylate, 2-hydroxy-3-(1- naphthoxy)propyl (meth)acrylate, and 2-hydroxy-3-(2-naphthoxy)propyl (meth)acrylate; heterocyclic (meth)acrylates such as 2-tetrahydroflufuryl(meth)acrylate, N-(meth)acryloyloxyethylhexahydrophthal imide, and 2-(meth)acryloyloxyethyl-N-carbazole; and caprolatone-modified compounds thereof.

Of those, in terms of transparency and heat resistance, (meth) acrylates preferably include: aliphatic (meth)acrylates, such as methyl (meth)acrylate, ethyl (meth)acrylate, butyl (meth)acrylate, and 2-ethylhexyl (meth)acrylate; the above alicyclic (meth) acrylates; the above aromatic (meth) acrylates; and the above heterocyclic (meth)acrylates.

Those compounds may be used independently or in combination of two or more thereof.

In the alkali-soluble (meth)acrylate polymer having a maleimide skeleton in the main chain of the component (A), the content of the repeating units (A-3) and (A-4) derived from compounds having a carboxyl group and an unsaturated ethylenic double bond is preferably in the range of 3 to 60 mass %. If it is 3% mass or more, the component (A) can be easily dissolved in a developing solution, such as an aqueous alkali solution. If it is 60 mass % or less, anti-developer property (the nature of a portion which is not removed by development and remained as a pattern is not affected by a developing solution) is good in the developing process for selectively removing a photosensitive resin composition layer to form a pattern by development as described later. From the above viewpoints, the content is more preferably in the range of 5 to 50 mass %, particularly preferably in the range of 10 to 40 mass %.

The structures of the repeating units (A-3) and (A-4) derived from compounds having a carboxyl group and an ethylenic unsaturated group are not specifically limited as long as they are represented by the general formulae (3) and (4), respectively.

Compounds each having a carboxyl group and an ethylenic unsaturated group and serving as raw materials for the repeating unit (A-3) include, for example, (meth) acrylic acid, maleic acid, fumaric acid, crotonic acid, itaconic acid, citraconic acid, mesaconic acid, and cinnamic acid. Of those, in terms of transparency and alkaline solubility, (meth) acrylic acid, maleic acid, fumaric acid, and crotonic acid are preferred.

Further, maleic anhydride may be used as a raw material and polymerized, followed by ring-opening with appropriate alcohol, such as methanol, ethanol, or propanol, thereby converting to the structure of the repeating unit (A-3).

Those compounds can be used independently or in combination of two or more thereof.

Examples of the compound serving as a raw material for the repeating unit (A-4) and having a carboxyl group and an ethylene unsaturated group include mono (2-(meth)acryloyloxyethyl)succinate, mono(2-(meth)acryloyloxyethyl)phthalate, mono(2-(meth)acryloyloxyethyl)isophthalate, mono(2-(meth)acryloyloxyethyl)terephthalate, mono(2-(meth)acryloyloxyethyl)tetrahydrophthalate, mono(2-(meth)acryloyloxyethyl)hexahydrophthalte, mono(2-(meth)acryloyloxyethyl)hexahydroisophthalate, mono(2-(meth)acryloyloxyethyl)hexahydroterephthalate, ω-carboxypolycaprolactone mono(meth)acrylate, 3-vinylbenzoate, and 4-vinylbenzoate.

Of those, mono(2-(meth)acryloyloxyethyl)succinate, mono(2-(meth)acryloyloxyethyl)tetrahydrophthalate, mono (2-(meth)acryloyloxyethyl)hexahydrophthalate, mono(2-(meth)acryloyloxyethyl)hexahydroisophthalate, and mono (2-(meth)acryloyloxyethyl)hexahydroterephthalate are preferred from the viewpoint of transparency and alkali solubility.

Those compounds can be used independently or in combination of two or more thereof.

In addition, the alkali-soluble (meth)acrylate polymer having a maleimide skeleton in the main chain of the component (A) may include an additional repeating structure other than the repeating structures (A-1) to (A-4) if required.

Examples of the compounds having ethylenic unsaturated groups and serving as raw materials for such repeating structures include, but not specifically limited to, styrene, α-methyl styrene, vinyl toluene, vinyl chloride, vinyl acetate, vinyl pyridine, N-vinyl pyrrolidine, N-vinyl carbazole, butadiene, isoprene, and chloroprene. Of those, in terms of heat resistance and transparency, styrene, α-methyl styrene, vinyl toluene, and N-vinyl carbazole are preferably used.

Those compounds can be used independently or in combination of two or more thereof.

The synthesis method for the alkali-soluble (meth) acrylate polymer having a maleimide skeleton in the main chain of the component (A) is not specifically limited. It may be obtained by copolymerization of maleimide as a raw material for the repeating unit (A-1), (meth)acrylate as a raw material for the repeating unit (A-2), and a compound having a carboxyl group and an ethylenic unsaturated group as a raw material for the repeating unit (A-3) and/or the repeating unit (A-4), and optionally any of other compounds having ethylenic unsaturated groups while being heated using a thermal radical polymerization initiator. In this case, if required, an organic solvent may be used as a reaction solvent.

Examples of the thermal radical polymerization initiator are not limited, and include: ketone peroxides such as methylethyl ketone peroxide, cyclohexanone peroxide, methylcyclohexanone peroxide; peroxyketals such as 1,1-bis(t-butylperoxy)cyclohexane, 1,1-bis(t-butylperoxy)-2-methylcyclohexane, 1,1-bis(t-butylperoxy)-3,3,5-trimethylcyclohexane, 1,1-bis(t-hexylperoxy)cyclohexane, and 1,1-bis(t-hexylperoxy)-3,3,5-trimethylcyclohexane; hydroperoxides such as p-methane hydroperoxide; dialkyl peroxides such as α, α'-bis(t-butylperoxy)diisopropylbenzene, dicumylperoxide, t-butylcumyl peroxide, and di-t-butyl peroxide; diacylperoxides such as octanoyl peroxide, lauroyl peroxide, stearyl peroxide, and benzoyl peroxide; peroxycarbonates such as bis(4-t-butylcyclohexyl)peroxydicarbonate, di-2-ethoxyethyl peroxydicarbonate, di-2-ethylhexyl peroxydicarbonate, and di-3-methoxybutyl peroxycarbonate; peroxyesters such as t-butyl peroxypivalate, t-hexyl peroxypivalte, 1,1,3,3-tetramethylbutylperoxy-2-ethylhexanoate, 2,5-dimethyl-2,5-bis(2-ethylhexanoylperoxy)hexane, t-hexylperoxy-2-ethylhexanoate, t-butylperoxy-2-ethylhexanoate, t-butylperoxyisobutyrate, t-hexylperoxyisopropyl monocarbonate, t-butylperoxy-3,5,5-trimethylhexanoate, t-butylperoxylaurylate, t-butylperoxyisopropyl monocarbonate, t-butylperoxy-2-ethylhexyl monocarbonate, t-butylperoxybenzoate, t-hexylperoxybenzoate, 2,5-dimethyl-2,5-bis (benzoylperoxy)hexane, t-butylperoxyacetate; and azo compounds such as 2,2'-azobis(isobutyronitrile), 2,2'-azobis (2,4-dimethylvaleronitrile), and 2,2'-azobis(4-methoxy-2'-dimethylvaleronitrile).

The organic solvent used as the reaction solvent is not limited as long as the organic solvent can dissolve the alkali soluble (meth)acrylate polymer having a maleimide skeleton in the main chain of (A) component. Examples of the organic solvent include: aromatic hydrocarbons such as toluene, xylene, mesitylene, cumene, and p-cymene; cyclic ethers such as tetrahydrofurane and 1,4-dioxane; alcohols such as methanol, ethanol, isopropanol, butanol, ethylene glycol, and propylene glycol; ketones such as acetone, methylethyl ketone, methylisobutyl ketone, cyclohexanone, 4-hydroxy-4-methyl-2-pentanone; esters such as methyl acetate, ethyl acetate, butyl acetate, methyl lactate, ethyl lactate, and γ-butyrolactone; carbonates such as ethylene carbonate and propylene carbonate; polyalcohol alkylethers such as ethyleneglycol monomethylether, ethyleneglycol monoethylether, ethyleneglycol monobutylether, ethyleneglycol dimethylether, ethyleneglycol diethylether, propyleneglycol monomethylether, propyleneglycol monoethylether, propyleneglycol dimethylether, propyleneglycol diethylether, diethyleneglycol monomethylether, diethyleneglycol monoethylether, diethyleneglycol monobutylether, diethyleneglycol dimethylether, and diethyleneglycol diethylether; polyalcohol alkylether acetates such as ethyleneglycol monomethylether acetate, etheyleneglycol monoethylether acetate, ethyleneglycol monobutylether acetate, propyleneglycol monomethylether acetate, propyleneglycol monoethylether acetate, diethyleneglycol monomethylether acetate, and diethyleneglycol monoethylether acetate; amides such as N,N-dimethylformamide, N,N-dimethylacetamide, and N-methylpyrrolidone.

Those organic solvents may be used singly or two or more thereof may be used in combination.

Further, the alkali-soluble (meth)acrylate polymer having a maleimide skeleton in the main chain of the component (A) may contain an ethylenic unsaturated group on the side chain thereof if required. Its composition and synthetic method are not specifically limited. For example, the above (meth)acrylate polymer can be provided with an ethylenic unsaturated group on its side chain by an addition reaction of a compound having at least one ethylenic unsaturated group and one functional group, such as an epoxy group, an oxycetanyl group, an isocyanate group, a hydroxyl group, or a carboxyl group.

Examples of the compounds are not limited, and include: compounds each having an ethylene unsaturated group and an epoxy group, such as glycidyl(meth)acrylate, α-ethylglycidyl(meth)acrylate, α-propylglycidyl(meth)acrylate, α-butylglycidyl(meth)acrylate, 2-methylglycidyl(meth)acrylate, 2-ethylglycidyl(meth)acrylate, 2-propylglycidyl(meth)acrylate, 3,4-epoxybutyl(meth)acrylate, 3,4-epoxyheptyl(meth) acrylate, α-ethyl-6,7-epoxyheptyl(meth)acrylate, 3,4-epoxycyclohexylmethyl(meth)acrylate, o-vinylbenzylglycidyl ether, m-vinylbenzylglycidyl ether, and p-vinylbenzylglycidyl ether; compounds having an ethylene unsaturated group and an oxetanyl group, such as (2-ethyl-2-oxetanyl)methyl (meth)acrylate, (2-methyl-2-oxetanyl)methyl(meth)acrylate, 2-(2-ethyl-2-oxetanyl)ethyl(meth)acrylate, 2-(2-methyl-2-oxetanyl)ethyl(meth)acrylate, 3-(2-ethyl-2-oxetanyl)propyl (meth)acrylate, and 3-(2-methyl-2-oxetanyl)propyl(meth) acrylate; compounds having an ethylene unsaturated group and an isocyanate group, such as 2-(meth)acryloyloxyethyl isocyanate; compounds having an ethylene unsaturated group and a hydroxyl group, such as 2-hydroxyethyl(meth)acrylate, 2-hydroxypropyl(meth)acrylate, 3-chloro-2-hydroxypropyl (meth)acrylate, and 2-hydroxybutyl(meth)acrylate; and compounds having an ethylene unsaturated group and a carboxyl group, such as (meth) acrylic acid, crotonic acid, cinnamic acid, (2-(meth)acryloyloxyethyl)succinate, 2-phthaloylethyl (meth)acrylate, 2-tetrahydrophthaloylethyl (meth)acrylate, 2-hexahydrophthaloylethyl (meth)acrylate, ω-carboxylpolycaprolactone mono (meth)acrylate, 3-vinylbenzoate, and 4-vinylbenzoate.

Of those, glycidyl(meth)acrylate, 3,4-epoxycyclohexylmethyl(meth)acrylate, isocyanic acid ethyl(meth)acrylate, 2-hydroxyethyl(meth)acrylate, 2-hydroxypropyl(meth)acrylate, 2-hydroxybutyl(meth)acrylate, (meth) acrylic acid, crotonic acid, and 2-hexahydrophthaloylethyl(meth) acrylate are preferred from the viewpoint of the transparency and reactivity.

Those organic solvents may be used singly or two or more thereof may be used in combination.

The average molecular weight of the alkali-soluble (meth) acrylate polymer having a maleimide skeleton in the main chain in the component (A) is preferably in the range of 1,000 to 3,000,000. If it is 1,000 or more, a large molecular weight leads to a sufficient strength of a hardened product in the case of using as a resin composition. If it is 3,000,000 or less, it leads to good solubility to a developing solution made of an aqueous alkali solution and compatibility to the polymerizable compound (B). From the view point of the above description, a molecular weight of 3,000 to 2,000,000 is more preferred. A molecular weight of 5,000 to 1,000,000 is particularly preferred.

Note that the weight average molecular weight in the present invention is a value determined by measurement by gel permeation chromatography (GPC) and calculation in terms of standard polystyrene.

The acid value of the alkali-soluble (meth)acrylate polymer having a maleimide skeleton in the main chain in the component (A) can be defined so that development can be attained using any of various known developing solutions in the process of forming pattern by selectively removing a photosensitive resin composition layer by the development as described later. For instance, in the case of the development with an aqueous alkali solution of sodium carbonate, potassium carbonate, tetramethyl ammonium hydroxide, triethanolamine, or the like, the acid value is preferably in the range of 20 to 300 mgKOH/g. If it is 20 mgKOH/g or more, the development can be easily carried out. If it is 300 mgKOH/g or less, there is no decrease in anti-developer property. From the viewpoint of the above description, a range of 30 to 250 mgKOH/g is more preferred. A range of 40 to 200 mgKOH/g is particularly preferred.

In the case of developing with an aqueous alkali solution made of water or an aqueous alkali solution and one or more of surfactants, the acid value thereof is preferably in the range of 10 to 260 mgKOH/Hg. If the acid value is 10 mgKOH/g or more, the development can be easily performed. If it is 260 mgKOH/g or less, there is no decrease in anti-developer property. From the viewpoint of the above description, a range of 20 to 250 mgKOH/g is more preferred. A range of 30 to 200 mgKOH/g is particularly preferred.

The blending amount of the component (A) is preferably 10 to 85 mass % with respect to the total mass of the components (A) and (B). If it is 10 mass % or more, a hardened product of the resin composition for an optical material has sufficient strength and plasticity. If it is 85 mass % or less, the component (A) may be tangled with the component (B) and easily hardened when exposed. Thus, there is no lack of anti-developer property. From the viewpoint of the above description, a range of 20 to 80 mass % is more preferred. A range of 25 to 75 mass % is particularly preferred.

Hereinafter, the component (B) used in the present invention will be described.

The polymerizable compound of the component (B) is not specifically limited as long as it can be polymerized by heating, UV irradiation, or the like. Examples of such a compound preferably include compounds having polymerizable substituents, such as ethylenic unsaturated groups.

Specifically, the compounds include: (meth)acrylate, vinylidene halide, vinyl ether, vinyl ester, vinyl pyridine, vinyl amide, and arylated vinyl. Of those, in terms of transparency, (meth) acrylate and arylated vinyl are preferred. The (meth)acrylate may be any of monofunctional, difunctional, or polyfunctional (meth) acrylate.

Examples of the monofunctional (meth)acrylate include: aliphatic (meth)acrylates such as methyl(meth)acrylate, ethyl (meth)acrylate, butyl(meth)acrylate, isobutyl(meth)acrylate, tert-butyl(meth)acrylate, butoxyethyl(meth)acrylate, isoamyl(meth)acrylate, hexyl(meth)acrylate, 2-ethylhexyl (meth)acrylate, heptyl(meth)acrylate, octylheptyl(meth) acrylate, nonyl(meth)acrylate, decyl(meth)acrylate, undecyl (meth)acrylate, lauryl(meth)acrylate, tridecyl(meth)acrylate, tetradecyl(meth)acrylate, pentadecyl(meth)acrylate, hexadecyl(meth)acrylate, stearyl(meth)acrylate, behenyl(meth) acrylate, 2-hydroxyethyl(meth)acrylate, 2-hydroxypropyl (meth)acrylate, 3-chloro-2-hydroxypropyl(meth)acrylate, 2-hydroxybutyl(meth)acrylate, methoxypolyethyleneglycol (meth)acrylate, ethoxypolyethyleneglycol (meth)acrylate, methoxypolypropyleneglycol(meth)acrylate, ethoxypolypropyleneglycol(meth)acrylate, mono(2-(meth)acryloyloxyethyl)succinate; alicyclic (meth)acrylates such as cyclohexyl(meth)acrylate, cyclopentyl(meth)acrylate, dicyclopentanyl(meth)acrylate, dicyclopentenyl(meth)acrylate, isobornyl(meth)acrylate, mono(2-(meth)acryloyloxyethyl)tetrahydrophthalate, and mono(2-(meth)acryloyloxyethyl)hexahydrophthalate; aromatic (meth)acrylates such as benzyl(meth)acrylate, phenyl(meth)acrylate, o-biphenyl (meth)acrylate, 1-naphthyl(meth)acrylate, 2-naphthyl(meth) acrylate, phenoxyethyl(meth)acrylate, p-cumylphenoxyethyl(meth)acrylate, o-phenylphenoxyethyl(meth)acrylate, 1-naphthoxyethyl(meth)acrylate, 2-naphthoxyethyl(meth) acrylate, phenoxypolyethyleneglycol (meth)acrylate, nonylphenoxypolyethyleneglycol (meth)acrylate, pehnoxypolypropyleneglycol (meth)acrylate, 2-hydroxy-3-phenoxypropyl(meth)acrylate, 2-hydroxy-3-(o-phenylphenoxy)propyl(meth)acrylate, 2-hydroxy-3-(1-naphthoxy)propyl(meth)acrylate, and 2-hydroxy-3-(2-naphthoxy)propyl(meth)acrylate; heterocyclic (meth) acrylates such as 2-tetrahydroflufuryl(meth)acrylate, N-(meth)acryloyloxyethylhexahydrophthal imide, and 2-(meth)acryloyloxyethyl-N-carbazole; and caprolatone-modified compounds thereof.

Of those, the alicyclic (meth)acrylates, the aromatic (meth) acrylates, and the heterocyclic (meth)acrylates are preferred from the viewpoint of the transparency and reactivity.

Examples of the bifunctional (meth)acrylate include: aliphatic (meth)acrylates such as ethyleneglycol di(meth)acrylate, diethyleneglycol di(meth)acrylate, triethyleneglycol di(meth)acrylate, tetraethyleneglycol di(meth)acrylate, polyethyleneglycol di(meth)acrylate, propyleneglycol di(meth) acrylate, dipropyleneglycol di(meth)acrylate, tripropyleneglycol di(meth)acrylate, tetrapropyleneglycol di(meth) acrylate, polypropyleneglycol di(meth)acrylate, ethoxylated polypropyleneglycol di(meth)acrylate, 1,3-butanediol di(meth)acrylate, 1,4-butanediol di(meth)acrylate, neopentylglycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerine di(meth)acrylate, tricyclodecanedimethanol di(meth) acrylate, and ethoxylated 2-methyl-1,3-propanediol di(meth) acrylate; alicyclic (meth)acrylates such as cyclohexanedimethanol (meth)acrylate, ethoxylated cyclohexanedimethanol (meth)acrylate, propoxylated cyclohexanedimethanol (meth)acrylate, ethoxylated propoxylated cyclohexanedimethanol (meth)acrylate, tricyclodecanedimethanol (meth)acrylate, ethoxylated tricyclodecanedimethanol (meth)acrylate, propoxylated tricyclodecanedimethanol (meth)acrylate, ethoxylated propoxylated tricyclodecanedimthanol (meth)acrylate, ethoxylated hydrogenated bisphenol A di(meth)acrylate, propoxylated hydrogenated bisphenol A di(meth)acryalte, ethoxylated propoxylated hydrogenated bisphenol A di(meth)acryalte, ethoxylated hydrogenated bisphenol F di(meth)acrylate, propoxylated hydrogenated bisphenol F di(meth)acrylate, and ethoxylated propoxylated hydrogenated bisphenol F di(meth)acrylate; aromatic (meth)acrylates such as ethoxylated bisphenol A di(meth)acrylate, propoxylated bisphenol A di(meth)acrylate, ethoxylated propoxylated bisphenol A di(meth)acrylates, ethoxylated bisphenol F di(meth)acrylate, propoxylated bisphenol F di(meth)acrylate, ethoxylated propoxylated bisphenol F di(meth)acrylate, ethoxylated bisphenol AF di(meth)acrylate, propoxylated bisphenol AF di(meth)acrylate, ethoxylated propoxylated bisphenol AF di(meth)acrylate, ethoxylated fluorene-type di(meth)acrylate, propoxylated fluorene-type di(meth)acrylate, and ethoxylated propoxylated fluorene-type di(meth)acrylate; heterocyclic(meth)acrylates such as ethoxylated isocyanuric acid di(meth)acrylate, propoxylated isocyanuric acid di(meth)acrylate, and ethoxylated propoxylated isocyanuric acid di(meth)acrylate; caprolactone-modified compounds thereof; aliphatic epoxy (meth)acrylates such as neopentylglycol-type epoxy(meth)acrylate; alicyclic epoxy(meth)acrylates such as cyclohexanedimethanol-type epoxy(meth)acrylate, hydrogenated bisphenol A-type epoxy(meth)acrylate, and hydrogenated bisphenol F-type epoxy(meth)acrylate; aromatic epoxy (meth)acrylates such as resorcinol-type epoxy(meth)acrylate, bisphenol A-type epoxy(meth)acrylate, bisphenol F-type epoxy(meth)acrylate, bisphenol AF-type epoxy(meth)acrylate, and fluorene-type epoxy(meth) acrylate.

Of those, the alicyclic (meth)acrylates, the aromatic (meth) acrylates, the heterocyclic (meth)acrylates, the alicyclic epoxy(meth)acrylates, and the aromatic epoxy(meth)acrylates are preferred from the viewpoint of the transparency and heat resistance.

Examples of polyfunctional (meth)acrylate having a trifunctional group or more include: aliphatic (meth)acrylates such as trimethylolpropane tri(meth)acrylate, ethoxylated trimethylolpropane tri(meth)acrylate, propoxylated trimethylolpropane tri(meth)acrylate, ethoxylated propoxylated trimethylolpropane tri(meth)acrylate, pentaerythritol tri(meth) acrylate, ethoxlated pentaerythritol tri(meth)acrylate, propoxylated pentaerythritol tri(meth)acrylate, ethoxylated propoxylated pentaerythritol tri(meth)acrylate, pentaerythritol tetra(meth)acrylate, ethoxylated pentaerythritol tetra (meth)acrylate, propoxylated pentaerythritol tetra(meth) acrylate, ethoxylated propoxylated pentaerythritol tetra (meth)acrylate, ditrimethylolpropane tetraacrylate, and dipentaerythritol hexa(meth)acrylate; heterocyclic (meth) acrylates such as ethoxylated isocyanuric acid tri(meth)acrylate, propoxylated isocyanuric acid tri(meth)acrylate, and ethoxylated propoxylated isocyanuric acid tri(meth)acrylate; caprolactone-modified compounds thereof; aromatic epoxy (meth)acrylates such as phenol novolac-type epoxy(meth) acrylate and cresol novolac-type epoxy(meth)acrylate.

Of those, the heterocyclic (meth)acrylates and aromatic epoxy(meth)acrylates are preferred from the viewpoint of the transparency and heat resistance.

Those compounds may be used independently or in combination of two or more thereof. Further, they may be used in combination with any of other polymerizable compounds.

In addition, in terms of heat resistance, the polymerizable compound of the component (B) used is preferably one or more compounds each containing in molecule: an ethylenic unsaturated group; and at least one selected from the group consisting of an alicyclic structure, an aryl group, an aryl oxy group, and an aralkyl group. Specifically, it includes (meth)

acrylate, N-vinyl carbazole, or the like each containing at least one selected from the group consisting of an alicyclic structure, an aryl group, an aryl oxy group, and an aralkyl group. Here, the term "aryl group" represents an aromatic carbonate group such as a phenyl group and a naphthyl group, and an aromatic heterocyclic group such as a carbazole group.

More specifically, the polymerizable compound of the component (B) used is preferably at least one of compounds represented by the following general formulae (5) to (8). Alternatively, the polymerizable compound of the component (B) used is more preferably at least one of compounds containing an aryl group and an ethylenic unsaturated group represented by the following general formulae (5) to (8).

[Chem 5]

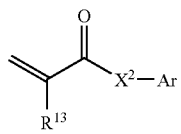
(5)

where Ar represents any of the following groups

[Chem 6]

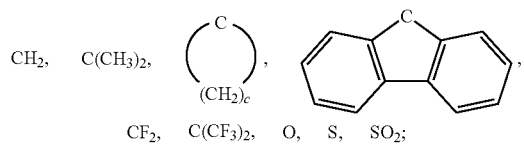

$X^2$ represents any of divalent groups of an oxygen atom (O), a sulfur atom (S), $OCH_2$, $SCH_2$, $O(CH_2CH_2O)_a$, $O(CH_2CH_3O)_b$, $O[CH_2CH(CH_3)O]_b$, $OCH_2CH(OH)CH_2O$;

$Y^1$ represents any of the following divalent groups

[Chem 7]

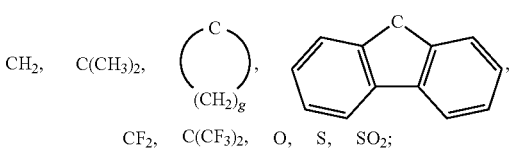

$R^{13}$ represents any of a hydrogen atom and a methyl group;

$R^{14}$ to $R^{30}$ each independently represent a hydrogen atom, a fluorine atom, an organic group having 1 to 20 carbon atoms, and a fluorine-containing organic group having 1 to 20 carbon atoms; and a and b each independently represent an integer of 1 to 20 and c represents an integer of 2 to 10).

[Chem 8]

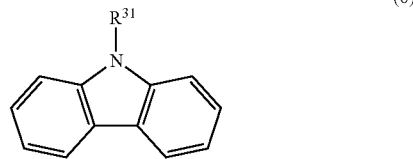
(6)

where $R^{31}$ represents any of the following groups

[Chem 9]

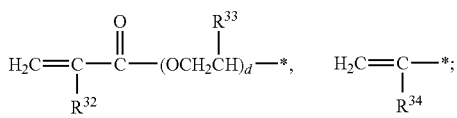

$R^{32}$ to $R^{34}$ each independently represent any of a hydrogen atom and a methyl group; and d represents an integer of 1 to 10.

[Chem 10]

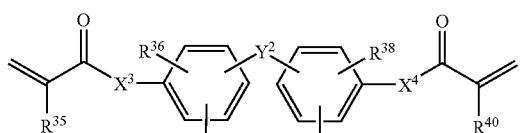
(7)

where $X^3$ and $X^4$ each independently represent any of divalent groups of O, S, $O(CH_2CH_2O)_e$, and $O[CH_2CH(CH_3)O]_f$;

$Y^2$ represents any of the following divalent groups

[Chem 11]

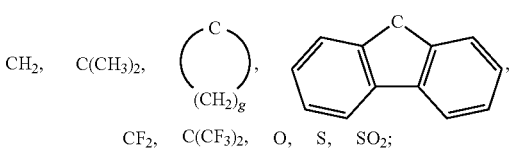

$R^{35}$ and $R^{40}$ each independently represent any of a hydrogen atom and a methyl group; $R^{36}$ to $R^{39}$ each represent a hydrogen atom, a fluorine atom, an organic group having 1 to 20 carbon atoms, and a fluorine-containing organic group having 1 to 20 carbon atoms; and e and f each independently represent an integer of 1 to 20 and g represents an integer of 2 to 10.

[Chem 12]

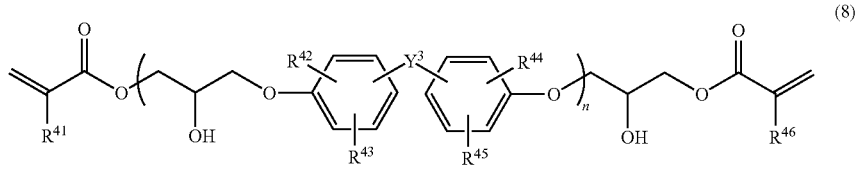

(8)

where $Y^3$ represents any of the following divalent groups

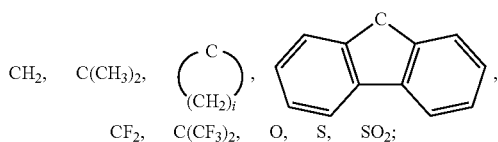

$CF_2$, $C(CF_3)_2$, O, S, $SO_2$;

$R^{41}$ and $R^{46}$ each independently represent any of a hydrogen atom and a methyl group; $R^{42}$ to $R^{45}$ each independently represent a hydrogen atom, a fluorine atom, an organic group having 1 to 20 carbon atoms, and a fluorine-containing organic group having 1 to 20 carbon atoms; and h represents an integer of 1 to 5 and i represents an integer of 2 to 10.

Here, examples of the organic groups in the general formulae (5) to (8) include those described in the general formulae (1) to (4).

In addition, preferable polymerizable compounds (B) other than (meth)acrylate include compounds each having two or more epoxy groups in molecule in terms of compatibility to the alkali-soluble (meth)acrylate polymer (A) having a maleimide skeleton in a main chain.

Specific examples thereof include: bifunctional phenol glycidyl ethers such as a bisphenol A type epoxy resin, a tetrabromobisphenol A type epoxy resin, a bisphenol F type epoxy resin, a bisphenol AF type epoxy resin, a bisphenol AD type epoxy resin, a biphenyl type epoxy resin, a naphthalene type epoxy resin, and a fluorene type epoxy resin; hydrogenated bifunctional phenol glycidyl ethers such as a hydrogenated bisphenol A type epoxy resin, a hydrogenated bisphenol F type epoxy resin, a hydrogenated 2,2'-bisphenol type epoxy resin, and a hydrogenated 4,4'-bisphenol type epoxy resin; polyfunctional phenol glycidyl ethers such as a phenol novolak type epoxy resin, a cresol novolak type epoxy resin, a dicyclopentadiene-phenol type epoxy resin, and a tetraphenylolethane type epoxy resin; bifunctional aliphatic alcohol glycidyl ethers such as a polyethylene glycol type epoxy resin, a polypropylene glycol type epoxy resin, a neopentyl glycol type epoxy resin, and a 1,6-hexanediol type epoxy resin; bifunctional alicyclic alcohol glycidyl ethers such as a cyclohexane dimethanol type epoxy resin and a tricyclodecane dimethanol type epoxy resin; polyfunctional aliphatic alcohol glycidyl ethers such as a trimethylolpropane type epoxy resin, a sorbitol type epoxy resin, and a glyceine type epoxy resin; bifunctional aromatic glycidyl esters such as diglycidyl phthalate; bifunctional alicyclic glycidyl esters such as diglycidyl tetrahydrophthalate and diglycidyl hexahydrophthalate; bifunctional aromatic glycidylamines such as N,N-diglycidylaniline and N,N-diglycidyltrifluoromethylaniline; polyfunctional aromatic glycidylamines such as N,N,N',N'-tetraglycidyl-4,4-diaminodiphenylmethane, 1,3-bis(N,N-glycidylaminomethyl)cyclohexane, and N,N,O-triglycidyl-p-aminophenol; bifunctional alicyclic epoxy resins such as alicyclic diepoxy acetal, alicyclic diepoxy adipate, alicyclic diepoxy carboxylate, and vinyl cyclohexene dioxide; polyfunctional alicyclic epoxy resins such as 1,2-epoxy-4-(2-oxiranyl)cyclohexane adducts of 2,2-bis(hydroxymethyl)-1-butanol; polyfunctional heterocyclic epoxy resins such as triglycidyl isocyanurate; and bifunctional or polyfunctional silicon-containing epoxy resins such as an organopolysiloxane type epoxy resin.

Of those, in terms of transparency and heat resistance, specific examples of the epoxy resins include: bifunctional phenol glycidyl ethers, such as a bisphenol A type epoxy resin, a bisphenol F type epoxy resin, a bisphenol AF type epoxy resin, a bisphenol AD type epoxy resin, a biphenyl type epoxy resin, a naphthalene type epoxy resin, and a fluorene type epoxy resin; the above hydrogenerated bifunctional phenol glycidyl ethers; the above polyfunctional phenol glycidyl ethers; the above bifunctional alicyclic alcohol glycidyl ethers; the above bifunctional aromatic glycidyl ethers; the above bifunctional alicyclic glycidyl ethers; the above bifunctional alicyclic epoxy resin; the above polyfunctional alicyclic epoxy resin; the above polyfunctional heterocyclic epoxy resin; and the above silicon-containing bifunctional or polyfunctional epoxy resin.

Those compounds may be used independently or in combination of two or more thereof. Further, they may be used in combination of any of other polymerizable compounds.

The blending amount of the polymerizable compound of the component (B) is preferably 15 to 90 mass % with respect to the total mass of the components (A) and (B). If it is 15 mass % or more, the alkali-soluble (meth)acrylate polymer (A) having a maleimide skeleton in the main chain may be tangled with the component (B) and easily hardened when exposed. Thus, there is no lack of anti-developer property. In addition, if it is 90 mass % or less, the film strength and the plasticity of the hardened film may be sufficient. From the viewpoint of the above description, a range of 30 to 80 mass % is more preferred.

Hereinafter, the component (C) used in the present invention will be described.

The polymerization initiator of the component (C) is not particularly limited as long as it can allow polymerization to start by heating, UV irradiation, or the like. For instance, in the case of using a compound having an ethylenic unsaturated group as a polymerizable compound of the composition (B), examples of the polymerization initiator include a thermal radical polymerization initiator and a photoradical polymerization initiator. Of those, the photoradical polymerization initiator is preferred because of its possibility to be hardened at a normal temperature at a high hardening rate.

Examples of the thermal radical polymerization initiator include: ketone peroxides such as methylethyl ketone peroxide, cyclohexanone peroxide, and methylcyclohexanone peroxide; peroxyketals such as 1,1-bis(t-butylperoxy)cyclohexane, 1,1-bis(t-butylperoxy)-2-methylcyclohexane, 1,1-bis(t-butylperoxy)-3,3,5-trimethylcyclohexane, 1,1-bis(t-hexylperoxy)cyclohexane, and 1,1-bis(t-hexylperoxy)-3,3,5-trimethylcyclohexane; hydroperoxides such as p-methane hydroperoxide; dialkyl peroxides such as α, α'-bis(t-butylperoxyl)diisopropylbenzene, dicumylperoxide, t-butylcumyl peroxide, and di-t-butyl peroxide; diacylperoxides such as octanoyl peroxide, lauroyl peroxide, stearyl peroxide, and benzoyl peroxide; peroxycarbonates such as bis(4-t-butylcyclohexy)peroxydicarbonate, di-2-ethoxyethyl peroxydicarbonate, di-2-ethylhexyl peroxydicarbonate, and di-3-methoxybutyl peroxycarbonate; peroxyesters such as t-butyl peroxypivalate, t-hexyl peroxypivalte, 1,1,3,3-tetramethylbutylperoxy-2-ethylhexanoate, 2,5-dimethyl-2,5-bis(2-ethylhexanoylperoxy)hexane, t-hexylperoxy-2-ethylhexanoate, t-butylperoxy-2-ethylhexanoate, t-butylperoxyisobutyrate, t-hexylperoxyisopropyl monocarbonate, t-butylperoxy-3,5,5-trimethylhexanoate, t-butylperoxylaurylate, t-butylperoxyisopropyl monocarbonate, t-butylperoxy-2-ethylhexyl monocarbonate, t-butylperoxybenzoate, t-hexylperoxybenzoate, 2,5-dimethyl-2,5-bis(benzoylperoxy)hexane, and t-butylperoxyacetate; and azo compounds such as 2,2'-azobis(isobutylonitrile), 2,2'-azobis(2,4-dimethylvaleronitrile), and 2,2'-azobis(4-methoxy-2'-dimethylvaleronitrile).

Of those, the diacylperoxides, the peroxyesters, and the azo compounds are preferred from the viewpoint of curing property, transparency, and heat resistance.

Examples of the photoradical polymerization initiator include: benzoin ketals such as 2,2-dimethoxy-1,2-diphenylethane-1-one; α-hydroxy ketones such as 1-hydroxycyclohexylphenyl ketone, 2-hydroxy-2-methyl-1-phenylpropane-1-one and 1-[4-(2-hydroxyethoxy)phenyl]-2-hydroxy-2-methyl-1-propane-1-one; α-amino ketones such as 2-benzyl-2-dimethylamino-1-(4-morpholinophenyl)-butane-1-one, and 1,2-methyl-1-[4-(methylthio)phenyl]-2-morpholinopropane-1-one; oxime esters such as 1-[(4-phenylthio)phenyl]-1,2-octanedione-2-(benzoyl)oxime; phosphine oxides such as bis(2,4,6-trimethylbenzoyl)phenylphosphineoxide, bis(2,6-dimethoxybenzoyl)-2,4,4-trimethylpentylphosphine oxide, and 2,4,6-trimethylbenzoyl-diphenylphosphineoxide; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer; benzophenone compounds such as benzophenone, N,N'-tetramethyl-4,4'-diaminobenzophenone, N,N'-tetramethyl-4,4'-diaminobenzophenone, and 4-methoxy-4'-dimethylaminobenzophenone; quinone compounds such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ethers such as benzoinmethyl ether, benzomethyl ether, and benzoinphenyl ether; benzoin compounds such as benzoin, methylbenzoin, and ethylbenzoin; benzyl compounds such as benzyldimethyl ketal; acridine compounds such as 9-phenylacridine, 1,7-bis(9,9'-acridinylheptane); N-phenylglycine; and cumarine.

Further, in the above 2,4,5-triaryl imidazole dimer, the substituents of the aryl groups at two triaryl imidazole portions may be identical symmetrical compounds or may be different dissymmetric compounds. In addition, like a combination of diethyl thioxanthone and dimethylaminobenzoic acid, a thioxanthone compound and a tertiary amine may be combined together.

Of those, in terms of hardenability, transparency, and heat resistance, the above α-hydroxyl ketone and the above phosphine oxide are preferred. These thermal and photoradical polymerization initiators may be used independently or in combination of two or more thereof. Further, it may be also used in combination with an appropriate sensitizer.

Further, in the case of using an epoxy resin as a polymerizable compound of the component (B), the polymerization initiator of the component (C) may be a thermal cationic polymerization initiator, a photocationic polymerization initiator, or the like. Of those, the photocationic polymerization initiator is preferred because of its possibility to be hardened at a normal temperature at a high hardening rate.

Examples of the thermal cation polymerization initiator include: benzylsulfonium salts such as p-alkoxyphenylbenzylmethylsulfonium hexafluoroantimonate; pyridinium salts such as benzyl-p-cyanopyridinium hexafluoroantimonate, 1-naphthylmethyl-o-cyanopyridinium hexafluoroantiomoate, and cinnamyl-o-cyanopyridinium hexafluoroantimonate; benzylammonium salts such as benzyldimethylphenylammonium hexafluoroantimonate.

Of those, the benzylsulfonium salts is preferred from the viewpoint of curing property, transparency, and heat resistance.

Examples of the photo cation polymerization initiator include: diaryldiazonium salts such as p-methoxybenzenediazonium hexafluorophosphate; diaryliodonium salts such as diphenyliodonium hexafluorophosphate and diphenyliodonium hexafluoroantiomonate; triarylsulfonium salts such as triphenylsulfonium hexafluorophosphate, triphenylsulfonium hexafluoroantimonate, diphenyl-4-thiophenoxyphenyl-sulfonium hexafluorophosphate, diphenyl-4-thiophenoxyphenylsulfonium hexafluoroantimonate, and diphenyl-4-thiophenoxyphenylsulfonium pentafluorohydroxyantimonate; triarylselenium salts such as triphenylselenium hexafluorophosphate, triphenylselenium tetrafluoroborate, and triphenylselenium hexafluoroantimonate; dialkylphenacylsulfonium salts such as dimethylphenacylsulfonium hexafluoroantimonate, and diethylphenacylsulfonium hexafluoroantimonate; dialkyl-4-hydroxyl salts such as 4-hydroxyphenyldimethylsulfonium hexafluoroantimonate and 4-hydroxyphenylbenzylmethylsulfonium hexafluoroantimonate; and phosphates such as α-hydroxymethylbenzoyl sulfonate, N-hydroxyimide sulfonate, α-sulfonyloxy ketone, and β-sulfonyloxy ketone.

Of those, in terms of hardenability, transparency, and heat resistance, the above triaryl sulfonium salt is preferred. These thermal and photocationic polymerization initiators may be used independently or in combination of two or more thereof. Further, it may be also combined with an appropriate sensitizer.

The blending amount of the polymerization initiator of the component (C) is preferably 0.1 to 10 parts by mass with respect of 100 parts by mass of the component (A) and the component (B) in total. If it is 0.1 part by mass or more, the hardening may be sufficient. If it is 10 parts by mass or less, sufficient optical transparency may be obtained. From the viewpoint of the above description, a range of 0.3 to 7 parts by mass is more preferred. A range of 0.5 to 5 parts by mass is particularly preferred.

If required, further, the resin composition for an optical material of the present invention may be further added with a so-called additive, such as an antioxidant, an yellowing inhibitor, a UV absorber, a visible-light absorbent, a coloring agent, a plasticizer, a stabilizer, or a filler, in such a ratio that it does not adversely affect the effects of the present invention.

Hereinafter, the resin composition for an optical material of the present invention will be described.

The resin composition for an optical material of the present invention may be diluted with a favorable organic solvent and then used as a resin varnish for an optical material. The organic solvent used herein is not particularly limited as long as the resin composition can be dissolved therein. Examples of the organic solvent include: aromatic hydrocarbons such as toluene, xylene, mesitylene, cumene, and p-cymene; cyclic ethers such as tetrahydrofuran and 1,4-dioxane; alcohols such as methanol, ethanol, isopropanol, butanol, ethyleneglycol, and propylene glycol; ketones such as acetone, methylethyl ketone, methylisobutyl ketone, cyclohexanone, and 4-hydroxy-4-methyl-2-pentanone; esters such as methyl acetate, ethyl acetate, butyl acetate, methyl lactate, ethyl lactate, and γ-butyrolactone; carbonates such as ethylene carbonate and propylene carbonate; polyalcohol alkylethers such as ethyleneglycol monomethyl ether, ethyleneglycol monoethyl ether, ethyleneglycol monobutyl ether, ethyleneglycol dimethyl ether, ethyleneglycol diethyl ether, propyleneglycol monomethyl ether, propyleneglycol monoethyl ether, propyleneglycol dimethyl ether, propyleneglycol diethyl ether, diethyleneglycol monomethyl ether, diethyleneglycol monoethyl ether, diethyleneglycol monobutyl ether, diethyleneglycol dimethyl ether, and diethyleneglycol diethyl ether; polyalcohol alkylether acetates such as ethyleneglycol monomethylether acetate, etheyleneglycol monoethylether acetate, ethyleneglycol monobutylether acetate, propyleneglycol monomethylether acetate, propyleneglycol monoethylether acetate, diethyleneglycol monomethylether acetate, and diethyleneglycol monoethylacetate; amides such as N,N-dimethylformamide, N,N-dimethylacetamide, and N-methylpyrrolidone.

Of those, toluene, methanol, ethanol, isopropanol, acetone, methylethyl ketone, methylisobutyl ketone, cyclohexanone, methyl acetate, ethyl acetate, butyl acetate, methyl lactate, ethyl lactate, ethyleneglycol monomethylether, ethyleneglycol monoethylether, propyleneglycol monomethylether, propyleneglycol monoethylether, diethyleneglycol dimethylether, ethyleneglycol monomethylether acetate, propyleneglycol monomethyl ether acetate, and N,N-dimethylacetamide are preferred from the viewpoint of the solubility and boiling point.

Those organic solvents may be used singly or two or more thereof may be used in combination.

In general, further, the concentration of a solid in the resin varnish is preferably 20 to 80 mass %.

When a resin varnish for an optical material is prepared, mixing is preferably carried out by agitation. An agitation method is, but not specifically limited to, preferably agitation with a propeller in terms of agitation efficiency. The rotational speed of the propeller is, but not specifically limited to, preferably 10 to 1,000 rpm. If it is 10 rpm or more, each of the components (A) to (C) and the organic solvent can be sufficiently mixed with one another. If it is 1,000 rpm or less, the degree of sucking air bubbles into the mixture by the rotation of the propeller is lowered. From the above viewpoint, a range of 50 to 800 rpm is more preferred. A range of 100 to 500 rpm is particularly preferred. The stirring time is, but not specifically limited to, preferably 1 to 24 hours. If it is 1 hour or more, each of the components (A) to (C) and the organic solvent can be sufficiently mixed with one another. If it is 24 hours or less, the time required for preparing the varnish can be shortened.

The prepared resin varnish for an optical material is preferably filtrated through a filter with a pore size of 50 μm or less. If the pore size is 50 μm or less, larger foreign materials or the like can be removed. Thus, the scattering of light passing through a core part can be prevented without repelling when the varnish is applied. From the above viewpoint, a filter having a pore size of 30 μm or less is more preferably used in the filtration. A filter having a pore size of 10 μm or less is particularly preferably used in the filtration.

The prepared resin varnish for an optical material is preferably subjected to defoaming under reduced pressure. A defoaming method is not specifically limited. As a specific example, a vacuum pump and a glass bell jar, or a defoaming apparatus with a vacuum device can be used. The pressure at the time of pressure reduction is, but not specifically limited to, preferably a pressure at which an organic solvent in the resin varnish does not boil. The time for defoaming under reduced pressure is, but not specifically limited to, preferably 3 to 60 minutes. If it is 3 minutes or more, air bubbles dissolved in the resin varnish can be removed. If it is 60 minutes or less, an organic solvent in the resin varnish will not vaporize.

A hardened film obtained by polymerization and hardening of a resin composition for an optical material including the alkali-soluble (meth)acrylate polymer having a maleimide skeleton in the main chain of the component (A), the polymerizable compound (B), and the polymerization initiator (C) has a refractive index of 1.400 to 1.700 at a wavelength of 830 nm at a temperature of 25° C. If it is in the range of 1.400 to 1.700, there is no increase in the refractive index with the usual optical resin. Thus, the versatility of the hardened film as an optical material is not spoiled. From the above viewpoint, the refractive index is more preferably 1.425 to 1.675 or less, particularly preferably 1.450 to 1.650.

A hardened film with a thickness of 50 μm, which is obtained by polymerization and hardening of a resin composition for an optical material including the alkali-soluble (meth)acrylate polymer having a maleimide skeleton in the main chain of the component (A), the polymerizable compound (B), and the polymerization initiator (C), preferably has a transmissivity of 80% or more at a wavelength of 400 nm. If it is 80% or more, the amount of the transmitted light is sufficient. From the above viewpoint, 85% or more is more preferred. Note that the upper limit of the transmissivity is not specifically limited.

Hereinafter, the resin film for an optical material of the present invention will be described.

The resin film for an optical material of the present invention is made of the above resin composition for an optical material. It can be easily manufactured by a process in which a resin varnish for an optical material including the compositions (A) to (C) is applied on a favorable base material film and a solvent is then removed therefrom. Alternatively, it may be manufactured by directly applying the resin composition for an optical material on a base material film.

Examples of the base material film are not particularly limited, and include: polyesters such as polyethyleneterephthalate, polybutyleneterephthalate, and polyethylenenaphthalate; polyolefins such as polyethylene and polypropylene; polycarbonate; polyamide; polyimide; polyamideimide; polyetherimide; polyethersulfide; polyethersulfone; polyetherketone; polyphenylether; polyphenylenesulfide; polyallylate; polysulfone; and liquid crystal polymer. Of those, polyetheylenenterephthalate, polybutyleneterephthalate, polyethethylenenaphthalate, polypropylene, polycarbonate, polyamide, polyimide, polyamideimide, polyphenylenether, polyphenylenesulfide, polyarylate, and polysulfone are preferred from the viewpoint of the flexibility and high toughness.

The thickness of the base material film may be arbitrarily changed depending on the desired flexibility, but is preferably in the range of 3 to 250 μm. If it is 3 μm or more, the film may be provided with sufficient strength. If it is 250 μm or less, the film may be provided with sufficient flexibility. From the above viewpoint, the thickness is more preferably 5 to 200 μm, particularly preferably 7 to 150 μm. From the viewpoint of an improvement of detachability from a resin layer, a film used may be one subjected to a mold-release treatment with a silicon compound, a fluorine-containing compound, or the like if required.

The resin film for an optical material manufactured by applying a resin varnish for an optical material or a resin composition for an optical material on a base material film may be optionally constructed of a three-layered structure: a base material film, a resin layer, and a protective film, which protective film being attached on the resin film.

Examples of the protective film include: but not specifically limited to, polyesters, such as polyethylene terephthalate, polybutylene terephthalate, and polyethylene naphthalate; and polyolefins, such as polyethylene and polypropylene. Of those, in terms of flexibility and toughness, polyesters, such as polyethylene terephthalate; and polyolefins, such as polyethylene and polypropylene, are preferred. Here, in terms of an improvement of detachability from the resin layer, a film used may be one subjected to a mold-release treatment with a silicon compound, a fluorine-containing compound, or the like if required. The thickness of a cover film may be properly changed depending on the desired flexibility, but is preferably in the range of 10 to 250 μm. If it is 10 μm or more, the film is provided with sufficient strength. If it is 250 μm or less, the film is provided with sufficient flexibility. From the above viewpoint, the thickness of the film is more preferably 15 to 200 μm, particularly preferably 20 to 150 μm.

The thickness of the resin layer of the resin film for an optical material of the present invention is not specifically limited. However, the thickness of the resin layer after drying is, in general, preferably 5 to 500 μm. If it is 5 μm or more, the thickness of the resin layer is sufficient enough to provide the resin film or a hardened product thereof with sufficient strength. If it is 500 μm or less, the drying can be sufficiently carried out. Thus, the amount of the remaining solvent in the resin film does not increase and foaming does not occur when the hardened product of the film is heated.

The resin film for an optical material thus obtained can be easily stored by, for example, taking up in a roll form. Alternatively, the film in the roll form may be cut into pieces with suitable dimensions and then stored in a sheet form.

The resin composition for an optical material of the present invention is suitable for a resin composition for the formation of an optical waveguide. Similarly, the resin film for an optical material of the present invention is suitable for a resin film for the formation of an optical waveguide.

Hereinafter, the optical waveguide of the present invention will be described.

FIG. 1(a) represents a cross-sectional view of an optical waveguide. The optical waveguide 1 is formed on a substrate 5 and constructed of a core part 2 made of a resin composition for core part formation with a high refractive index, and a lower clad layer 4 and an upper clad layer 3 made of a resin composition for clad layer formation with a low refractive index.

The resin composition for an optical material and the resin film for an optical material in accordance with the present invention are preferably used in at least one of the lower clad layer 4, the core part 2, and the upper clad layer 3 of the optical waveguide 1. Of those, from the viewpoint of the ability of pattern forming by a developing solution made of an aqueous alkali solution, it is more preferable to be used in at least the core part 2 among them.

The use of a resin film for an optical material can lead to a further increase in adhesiveness between the clad layer and the core layer and the ability of forming a pattern (ability of responding to the spacing between thin lines or narrow lines), thereby enabling the fine pattern formation with a small line width or line spacing. In addition, it becomes possible to provide a process with excellent productivity that can produce large-area optical waveguide at once.

In an optical waveguide 1, a substrate 5 used may be a hard substrate, such as a glass-epoxy resin substrate including a silicon substrate, a glass substrate and a FR-4 substrate. The optical waveguide 1 may be a flexible optical waveguide using the above flexible and tough base material film instead of the above substrate.

In addition, when the base material film having flexibility and toughness is used as the substrate 5, the substrate 5 may be functioned as a cover film of the optical waveguide 1. The arrangement of the cover film 5 can impart the flexibility and toughness of the cover film 5 to the optical waveguide 1. Therefore, the optical waveguide 1 can be prevented from contamination and blemish, so that it can be handled more easily.

From the above viewpoint, as shown in FIG. 1(b), the cover film 5 may be arranged on the outside of the upper clad layer 3. Alternatively, as shown in FIG. 1(c), the cover film 5 may be arranged on the outsides of both the lower clad layer 3 and the upper clad layer 3.

As long as the optical waveguide 1 is sufficiently provided with flexibility and toughness, the cover film 5 may not be arranged as shown in FIG. 1(d).

The thickness of the low clad layer 4 is, but not specifically limited to, preferably 2 to 200 μm. If it is 2 μm or more, the transmission light can be easily confined in the inside of the core. If it is 200 μm or less, the thickness of the optical waveguide 1 is not out of an allowable range. Here, the term "thickness of the low clad layer 4" means a distance from the boundary between the core part 2 and the lower clad layer 4 to the lower surface of the clad layer 4.

The thickness of the resin film for the formation of a low clad layer is not specifically limited, but it can be adjusted so that the thickness of the lower clad layer 4 after the hardening may be within the above range.

The height of the core part 2 is, but not specifically limited to, preferably within the range of 10 to 100 μm. If the core part has a height of 10 μm or more, the tolerance of alignment for the binding to light-receiving and light-emitting elements or an optical fiber after the formation of the optical waveguide does not decrease. If the tolerance is 100 μm or less, the binding efficiency for the binding to light-receiving and light-emitting elements or an optical fiber after the formation of the optical waveguide does not decrease. From the above viewpoint, the height of the core part is more preferably 15 to 80 μm, particularly preferably 20 to 70 μm. Further, the thickness of the resin film for the formation of a core part is not particularly limited and can be adjusted so that the height of the core portion after the hardening may be within the above range.

The thickness of the upper clad layer 3 is not specifically limited as long as it is within the range that allows the core part 2 to be embedded therein, but is preferably 12 to 500 µm after it is dried. The thickness of the upper clad layer 3 may be identical with or different from the thickness of the lower clad layer 4 formed at first. In terms of embedding the core part 2, the thickness of the upper clad layer 3 is preferably higher than that of the lower clad layer 4. Note that the term "thickness of the upper clad layer 3" means a distance from the boundary between the core part 2 and the lower clad layer 4 to the upper surface of the upper clad layer 3.

The optical waveguide of the present invention preferably has preferably an optical transmission loss of 0.3 dB/cm or less. If the optical transmission loss is 0.3 dB or less, the loss of light is small and the strength of a transmission signal is thus sufficient. From the above view point, 0.2 dB/cm or less is more preferred.

In addition, the optical waveguide of the present invention preferably has an optical transmission loss of 0.3 dB/cm or less after carrying out a reflow test three times at a maximum temperature of 265° C. If it is 0.3 dB/cm or less, the loss of light is small and the strength of a transmission signal is sufficient while the component mounting with a reflow process can be carried out. Thus, it can be widely applied. Here, the term "reflow test at a maximum temperature of 265° C." means a lead-free solder reflow test carried out under conditions according to JEDEC standard (JEDEC JESD22A113E).

Hereinafter, an application example of using the resin film for an optical material of the present invention as a resin film for the formation of an optical waveguide, which is the most suitable use thereof, will be described.

The resin film for the formation of an optical waveguide can be also manufactured in a manner similar to that of manufacturing the above resin film for an optical material. By the way, a substrate used in the process of manufacturing the resin film for forming a core part is not specifically limited as long as the substrate allows exposure active light used in the core-pattern formation as described later to pass therethrough. Examples of the substrate include: polyethylenes, such as polyethylene terephthalate, polybutylene terephthalate, and polyethylene naphthalate; polyolefines, such as polyethylene and polypropylene; polycarbonates; polyphenylene ethers; and polyarylates.

Of those, in the viewpoint of transmissivity, flexibility, and toughness of the exposure active light, polyesters, such as polyethylene terephthalate and polybutylene terephthalate, and polyolefines, such as polypropylene, are preferred. Further, in the viewpoint of an increase in transmissivity of the exposure active light and a decrease in roughness of the side wall of a core pattern, it is more preferable to use a high-transparent type base material film. Such a high-transparent type base material film includes Cosmo Shine A1517 and Cosmo Shine A4100, which are manufactured by Toyobo Co., Ltd. Here, in terms of an increase in detachability from the resin layer, any film subjected to a mold-releasing treatment with a silicon-based compound, a fluorine-containing compound, or the like may be used as necessary.

The thickness of the base material film of the resin film for the formation of a core part is preferably 5 to 50 µm. If it is 5 µm or more, sufficient strength as a substrate can be obtained. If it is 50 µm or less, an increase in size of the gap between a photomask and the resin composition layer for the formation of a core pattern does not occur when the core pattern is formed. Thus, it results in a good property of forming a pattern. From the above viewpoint, the thickness of the base material film is more preferably 10 to 40 µm, particularly preferably 15 to 30 µm.

The resin film for the formation of an optical waveguide, which is manufactured by applying a resin varnish for the formation of an optical waveguide or a resin composition for the formation of an optical waveguide on the above base material film, may be optionally of a three-layered structure constructed of a base material film, a resin film, and a protective film, which protective film being attached on the resin film if required.

The resin film for the formation of an optical waveguide thus obtained can be easily stored by being taken up in a roll form. Alternatively, the film in the roll form may be cut into pieces with suitable dimensions and then stored in a sheet form.

Hereinafter, a method of forming an optical waveguide 1 using a resin varnish for the formation of an optical waveguide and/or a resin film for the formation of an optical waveguide will be described.

The method of manufacturing the optical waveguide 1 of the present invention may be, but not specifically limited to, a method that carries out the production by a spin-coating method or the like using a resin varnish for the formation of a core part and a resin varnish for the formation of a clad layer, a method that carries out the production by a lamination method using a resin film for the formation of a core part and a resin film for the formation of a clad layer or the like. Alternatively, it may be manufactured by a combination of those methods. Of those, in terms of a possibility to provide a process for manufacturing an optical waveguide with excellent productivity, the method that carries out the production by a lamination method using the resin film for the formation of an optical waveguide is preferred.

Hereinafter, a manufacturing method of forming an optical waveguide 1 in which a resin film for the formation of an optical waveguide is used in a lower clad layer, a core part, and an upper clad layer.

At first, as a first step, a lower clad layer 4 is formed by laminating a resin film for the formation of a lower clad layer on a substrate 5. The lamination method in the first step may be a method of laminating by pressure-bonding with heat using a roll laminator or a flat-plate laminator. In terms of adhesion and followability, it is preferable to use a flat-plate laminator for laminating a resin film for the formation of a lower clad layer under reduced pressure. In the present invention, the term "flat-plate laminator" means a laminator for press-bonding such that lamination materials are sandwiched between a pair of flat plates and pressure is then applied on the flat plates. For example, a vacuum-pressure type laminator can be preferably used. The heating temperature used herein is preferably 40 to 130° C. The pressure at which pressure-bonding is performed is preferably 0.1 to 1.0 MPa. However, there is no limitation in those conditions. In the case of the presence of a protective film on the resin film for the formation of a lower clad layer, the lamination is carried out after removing the protective film.

Alternatively, before laminating by the vacuum-pressure type laminator, the resin film for the formation of a lower clad layer may be temporarily attached on the substrate 5 using the roll lamination. Here, for the viewpoint of improving adhesion and followability, the temporal attachment may be preferably performed while subjecting to press-bonding. The press-binding may be carried out using a laminator having a heat roll under heat. The lamination temperature is preferably 20 to 130° C. In other words, 20° C. or more leads to an increase in adhesion between the resin film for the formation of a lower clad layer and the substrate 5. If it is 130° C. or less, a required film thickness can be obtained without causing an excessive flow of a resin layer at the time of roll lamination. From the above viewpoint, the lamination temperature is more preferably 40 to 100° C. The pressure is preferably 0.2 to 0.9 MPa. The lamination rate is preferably 0.1 to 3 m/min. However, there is no limitation in those conditions.

Subsequently, the resin film for the formation of a lower clad layer laminated on the substrate 5 is hardened by application of light and/or heat to remove the base material film from the resin film for the formation of a lower clad layer, thereby forming a lower clad layer 4.

For the formation of the lower clad layer 4, the irradiation dose of active light beam is preferably 0.1 to 5 J/cm$^2$ and the heating temperature is preferably 50 to 200° C. However, there is no limitation in those conditions.

Then, as a second step, a resin film for the formation of a core part is laminated in a manner similar to that of the first step. Here, the resin film for the formation of a core part is preferably designed so that the refractive index thereof is higher than that of the resin film for the formation of a lower clad layer and preferably made of a photosensitive resin composition capable of forming a core pattern by active light beam.

Next, as a third step, the core part is exposed to form a core pattern (core part 2) of the optical waveguide. Specifically, an active light beam may be applied through a negative or positive mask pattern called artwork so that it forms an image. Alternatively, the active light beam may be directly by laser direct-drawing so that it forms an image without passing through a photomask. Examples of the light source for active light beam include known light sources that can effectively radiate ultraviolet ray, for example, a carbon arc lamp, a mercury vapor arc lamp, a super-high pressure mercury lamp, a high pressure mercury lamp, and a Xenon lamp. Besides, those light sources that effectively radiate visible light, such as a flood lamp for photography and a sunlight lamp, can also be used.

The irradiation amount of active light beam used herein is preferably 0.01 to 10 J/cm$^2$. The range is preferable because, if it is 0.01 J/cm$^2$ or more, a hardening reaction proceeds sufficiently and the core part 2 is not flown out in the step of development as described later and, if it is 10 J/cm$^2$ or less, a fine pattern can be formed without an increase in thickness of the core part 2 by an excess amount of exposure. From the above viewpoint, the irradiation amount of active light beam is more preferably 0.05 to 5 J/cm$^2$, particularly preferably 0.1 to 3 J/cm$^2$.

Alternatively, in terms of improving the resolution and adhesion of the core part 2, the application of heat may be performed after the exposure. The time period from the irradiation of UV and the application of heat after the exposure is preferably within 10 minutes. If it is within 10 minutes, an active species generated by the UV irradiation is not deactivated. The temperature of the heating after the exposure is preferably 40 to 160° C. and the time period thereof is preferably 30 seconds to 10 minutes.

After the exposure, the base material film of the resin film for the formation of a core part is removed. Then, the development is carried out by a known method, such as spray, oscillating dipping, brushing, scrapping, dipping, and puddling, using a developing liquid that corresponds to the composition of the above resin film for the formation of a core part, such as an alkaline aqueous solution or a water-based developing agent. Alternatively, if required, two or more kinds of the developing methods may be used in combination.

The bases that can be used for the above-mentioned alkaline aqueous solution include, but are not limited to, for example: alkali hydroxides such as hydroxides of lithium, sodium, and potassium; alkali carbonates such as carbonates or bicarbonates of lithium, sodium, and ammonium; alkali metal phosphates such as potassium phosphate, and sodium phosphate; alkali metal pyrophosphates such as sodium pyrophosphate and potassium pyrophosphate; sodium salts such as borax and sodium metasilicate; and organic bases such as tetramethyl ammonium hydroxide, triethanolamine, ethylenediamine, diethylenetriamine, 2-amino-2-hydroxymethyl-1,3-propandiol and 1,3-diaminopropanol-2-morpholine. Further, it is preferable that the alkaline aqueous solutions for development have a pH in the range of 9 to 11. The temperature of the alkaline aqueous solution is adjusted depending on the developability of the layer of the resin composition for forming core-part. The alkaline aqueous solutions may contain surfactants, defoaming agents, a small amount of organic solvent for promoting development, and the like.

The above water-based developing solution is not specifically limited as long as it may be made of: water or an aqueous alkali solution; and one or more organic solvents. The pH of the water-based developing solution is preferably as small as possible within in a range at which the development of the resin film for the formation of a core part can be sufficiently performed, more preferably pH 8 to 12, particularly preferably pH 9 to 10.

Examples of the organic solvent include: alcohols such as methanol, ethanol, isopropanol, butanol, ethyleneglycol, and propylene glycol; ketones such as acetone, and 4-hydroxy-4-methyl-2-pentanone; and polyalcohol alkylethers such as ethyleneglycol monomethylether, ethyleneglycol monoethylether, propyleneglycol monomethylether, propyleneglycol monoethylether, diethyleneglycol monomethylether, diethyleneglycol monoethylether, and diethyleneglycol monobutylether.

These organic solvents may be used independently or in combination of two or more thereof. In general, the concentration of the organic solvent is preferably 2 to 90 mass % and the temperature thereof is adjusted depending on the developability of the resin composition for the formation of a core part. In addition, the water-based developing solution may contain a small amount of a surfactant, a defoaming agent, or the like.

As the treatment after the development, the core part 2 of the optical waveguide may be washed with a washing solution made of water and the above organic solvent if required. The organic solvents may be used independently or in combination of two or more thereof. In general, the concentration of the organic solvent is preferably 2 to 90 mass %. The temperature thereof may be adjusted so as to correspond to the developability of the resin composition for the formation of a core part.

As the treatment after the development, heating at about 60 to 250° C. or exposure to about 0.1 to 1,000 mJ/cm$^2$ may be performed as necessary to further harden the core part 2.

Then, as a fourth step, a resin film for the formation of an upper clad layer is laminated in the same manner as those of the first and second steps to form an upper clad layer 3. Here, the resin film for the formation of the upper clad layer is designed so that the refractive index thereof can be smaller than that of the resin film for the formation of a core part. In addition, the thickness of the upper clad layer 3 may be preferably larger than the height of the core part 2.

Subsequently, in a manner similar to that of the first step, the resin film for the formation of an upper clad layer is hardened by light and/or heat to form an upper clad layer 3.

If the base material film of the resin film for the formation of a clad layer is made of PET, the irradiation amount of active light beam is preferably 0.1 to 5 J/cm$^2$. On the other hand, if the base material film is made of polyethylene naphthalate, polyamide, polyimide, polyamidoimide, polyetherimide, polyphenylene ether, polyether sulfide, polyether sulfone, or polysulfone, it hardly allow an active light beam, such as UV, with a short wavelength to pass through the base material film compared with PET. Thus, the active light beam has preferably an irradiation amount of 0.5 to 30 J/cm$^2$. A hardening reaction proceeds sufficiently when the irradiation amount is 0.5 J/cm$^2$ or more. The light irradiation does not take much time when the irradiation amount is 30 J/cm$^2$ or less. From the above viewpoint, the irradiation amount is preferably 3 to 27 J/cm$^2$, more preferably 5 to 25 J/cm$^2$.

Alternatively, for more hardening, a double-side exposure device capable of simultaneously irradiating from both sides with active beams may be used. In addition, the irradiation of active light beam may be carried out under heating. The heating temperature during and/or after the irradiation of active light beam may be preferably 50 to 200° C. However, there is no limitation in those conditions.

Alternatively, the optical waveguide 1 may be prepared by removing the base material film, if required, after forming the upper clad layer 3.

The optical waveguide of the present invention is excellent in heat resistance and transparency, so that it may be used as an optical transmission of an optical module. The configuration of the optical module may be, for example, an optical waveguide provided with optical fibers connected to both ends of the optical waveguide; an optical waveguide provided with connectors connected to both ends of the optical waveguide; a photoelectric composite substrate in which an optical waveguide is in complex with a print-wiring board; a photoelectric-converting module in which an optical waveguide is combined with a photoelectric-converting device for mutual conversion between an optical signal and an electric signal; or a wavelength-division-multiplexing device in which an optical waveguide is combined with a wavelength-division filter. Here, in the photoelectric composite substrate, the print wiring plate to be complex may be, but not specifically limited to, either of rigid substrates, such as a glass epoxy substrate, and flexible substrates, such as a polyimide substrate.

EXAMPLES

Hereinafter, examples of the present invention will be more specifically described. However, the present invention is not limited to those examples.

Production Example 1

Preparation of Alkali-Soluble (Meth)Acrylate Polymer P-1 Containing Maleimide Skeleton in Main Chain In a flask equipped with an agitating device, a cooling pipe, a gas conduit, a dropping funnel, and a thermometer, 150 parts by mass of propylene glycol monomethylether acetate and 30 parts by mass of methyl lactate were weighed and then stirred while a nitrogen gas was introduced in the flask. The temperature of the solution was increased to 80° C. Then, a mixture of 20 parts by mass of N-cyclohexyl maleimide, 40 parts by mass of dicyclopentanyl methacrylate, 25 parts by mass of 2-ethylhexyl methacrylate, 15 parts by mass of methacrylic acid, and 3 parts by mass of 2,2'-azobis(isobutyronitrile) was added dropwise, and the whole was stirred at 80° C. for 6 hours, whereby a solution of a (meth)acrylate polymer P-1 (solid content: 36 mass %) was obtained.

[Measurement of Acid Number]

The acid number of P-1 was measured and resulted in 98 mgKOH/g. Here, the acid number was calculated from the amount of a 0.1-mol/l aqueous potassium hydroxide solution required for neutralizing the P-1 solution. At this time, a point at which phenolphthalein added as an indicator colored pink from colorless was defined as a point of neutralization.

[Measurement of Weight Average Molecular Weight]

The weight average molecular weight (in terms of standard polystyrene) of P-1 was 27,000 as a result of the measurement using GPC (manufactured by Tosoh Corporation, SD-8022/DP-8020/RI-8020). Here, a column used was Gelpack GL-A150-S/GL-A160-S manufactured by Hitachi Chemical Co., Ltd.

Production Example 2

Preparation of Alkali-Soluble (Meth)Acrylate Polymer P-2 Containing Maleimide Skeleton in Main Chain In a flask equipped with an agitating device, a cooling pipe, a gas conduit, a dropping funnel, and a thermometer, 168 parts by mass (solid content: 60 mass %) of the above P-1 solution (solid content: 36 mass %), 0.03 part by mass of dibutyltin dilaurate, and 0.1 part by mass of p-methoxyphenol were weighed and stirred while being aerated. The temperature of the solution was increased to 60° C. and 7 parts by mass of 2-methacryloyl oxyethyl isocyanate was then added dropwise to the solution over 30 minutes. After that, the solution was continuously stirred at 60° C. for 4 hours, whereby a solution of a (meth)acrylate polymer P-2 (solid content: 38 mass %) was obtained.

The acid number and weight average molecular weight of P-2 were 53 mgKOH/g and 27,000, respectively, as a result of measurement conducted by the same methods as those of Production Example 1.

Production Example 3

Preparation of Alkali-Soluble (Meth)Acrylate Polymer P-3 Containing Maleimide Skeleton in Main Chain In a flask equipped with an agitating device, a cooling pipe, a gas conduit, a dropping funnel, and a thermometer, 97 parts by mass of propylene glycol monomethylether acetate and 24 parts by mass of ethyl lactate were weighed and then stirred while a nitrogen gas was introduced in the flask. The temperature of the solution was increased to 90° C. Then, a mixture of 18 parts by mass of N-cyclohexyl maleimide, 43 parts by mass of dicyclopentanyl methacrylate, 53 parts by mass of 2-hydroxyethyl methacrylate, 20 parts by mass of methacrylic acid, 2 parts by mass of 2,2'-azobis(isobutyronitrile), 65 parts by mass of propylene glycol monomethylether acetate, and 16 parts by mass of ethyl lactate was added dropwise over 3 hours, and the whole was stirred at 90° C. for 3 hours. The solution was further stirred at 120° C. for 1 hour, whereby a solution of a (meth)acrylate polymer P-3 (solid content: 40 mass %) was obtained.

The acid number and weight average molecular weight of P-3 were 96 mgKOH/g and 25,000, respectively, as a result of measurement conducted by the same methods as those of Production Example 1.

Production Example 4

Preparation of Alkali-Soluble (Meth)Acrylate Polymer P-4 Containing Maleimide Skeleton in Main Chain In a flask equipped with an agitating device, a cooling pipe, a gas conduit, a dropping funnel, and a thermometer, 150 parts by mass (solid content: 60 mass %) of the above P-3 solution (solid content: 40 mass %), 0.04 part by mass of dibutyltin dilaurate, 0.1 part by mass of p-methoxyphenol, and 21 parts by mass of propylene glycol monomethylether acetate were weighed and stirred while being aerated. The temperature of the solution was increased to 60° C. and 14 parts by mass of 2-methacryloyl oxyethyl isocyanate was then added dropwise to the solution over 30 minutes. After that, the solution was continuously stirred at 60° C. for 4 hours, whereby a solution of a (meth)acrylate polymer P-4 (solid content: 40 mass %) was obtained.

The acid number and weight average molecular weight of P-4 were 57 mgKOH/g and 25,000, respectively, as a result of measurement conducted by the same methods as those of Production Example 1.

Production Example 5

Preparation of Alkali-Soluble (Meth)Acrylate Polymer P-5 Containing Maleimide Skeleton in Main Chain In a flask equipped with an agitating device, a cooling pipe, a gas conduit, a dropping funnel, and a thermometer, 94 parts by mass of propylene glycol monomethylether acetate and 24 parts by mass of ethyl lactate were weighed and then stirred while a nitrogen gas was introduced in the flask. The temperature of the solution was increased to 90° C. Then, a mixture of 33 parts by mass of N-cyclohexyl maleimide, 26 parts by mass of dicyclopentanyl methacrylate, 51 parts by mass of 2-hydroxyethyl methacrylate, 19 parts by mass of methacrylic acid, 2 parts by mass of 2,2'-azobis(isobutyronitrile), 63 parts by mass of propylene glycol monomethylether acetate, and 16 parts by mass of ethyl lactate was added dropwise over 3 hours, and the whole was stirred at 90° C. for 3 hours. The solution was further stirred at 120° C. for 1 hour and then cooled to room temperature.

Subsequently, 0.08 part by mass of dibutyltin dilaurate, 0.2 part by mass of p-methoxyphenol, and 45 parts by mass of propylene glycol monomethylether acetate were added and then stirred while being aerated. The temperature of the solution was increased to 60° C. and 30 parts by mass of 2-methacryloyl oxyethyl isocyanate was then added dropwise to the solution over 30 minutes. After that, the solution was continuously stirred at 60° C. for 4 hours, whereby a solution of a (meth)acrylate polymer P-5 (solid content: 40 mass %) was obtained.

The acid number and weight average molecular weight of P-5 were 54 mgKOH/g and 23,000, respectively, as a result of measurement conducted by the same methods as those of Production Example 1.

Production Example 6

Preparation of Alkali-Soluble (Meth)Acrylate Polymer P-6 Containing Maleimide Skeleton in Main Chain In a flask equipped with an agitating device, a cooling pipe, a gas conduit, a dropping funnel, and a thermometer, 97 parts by mass of propylene glycol monomethylether acetate and 24 parts by mass of ethyl lactate were weighed and then stirred while a nitrogen gas was introduced in the flask. The temperature of the solution was increased to 90° C. Then, a mixture of 18 parts by mass of N-cyclohexyl maleimide, 43 parts by mass of benzil methacrylate, 53 parts by mass of 2-hydroxyethyl methacrylate, 20 parts by mass of methacrylic acid, 2 parts by mass of 2,2'-azobis(isobutyronitrile), 65 parts by mass of propylene glycol monomethylether acetate, and 16 parts by mass of ethyl lactate was added dropwise over 3 hours, and the whole was stirred at 90° C. for 3 hours. The solution was further stirred at 120° C. for 1 hour, whereby a solution of a (meth)acrylate polymer P-6 (solid content: 40 mass %) was obtained.

The acid number and weight average molecular weight of P-6 were 96 mgKOH/g and 24,000, respectively, as a result of measurement conducted by the same methods as those of Production Example 1.

Production Example 7

Preparation of Alkali-Soluble (Meth)Acrylate Polymer P-7 Containing Maleimide Skeleton in Main Chain In a flask equipped with an agitating device, a cooling pipe, a gas conduit, a dropping funnel, and a thermometer, 150 parts by mass (solid content: 60 mass %) of the above P-6 solution (solid content: 40 mass %), 0.04 part by mass of dibutyltin dilaurate, 0.1 part by mass of p-methoxyphenol, and 21 parts by mass of propylene glycol monomethylether acetate were weighed and stirred while being aerated. The temperature of the solution was increased to 60° C. and 14 parts by mass of 2-methacryloyl oxyethyl isocyanate was then added dropwise to the solution over 30 minutes. After that, the solution was continuously stirred at 60° C. for 4 hours, whereby a solution of a (meth)acrylate polymer P-7 (solid content: 40 mass %) was obtained.

The acid number and weight average molecular weight of P-7 were 58 mgKOH/g and 24,000, respectively, as a result of measurement conducted by the same methods as those of Production Example 1.

Production Example 8

Preparation of Alkali-Soluble (Meth)Acrylate Polymer P-8 Containing Maleimide Skeleton in Main Chain In a flask equipped with an agitating device, a cooling pipe, a gas conduit, a dropping funnel, and a thermometer, 60 parts by mass of propylene glycol monomethylether acetate and 60 parts by mass of methyl lactate were weighed and then stirred while a nitrogen gas was introduced in the flask. The temperature of the solution was increased to 90° C. Then, a mixture of 18 parts by mass of N-cyclohexyl maleimide, 61 parts by mass of benzyl methacrylate, 18 parts by mass of 2-hydroxyethyl methacrylate, 37 parts by mass of methacrylic acid, 2 parts by mass of 2,2'-azobis(isobutyronitrile), 40 parts by mass of propylene glycol monomethylether acetate, and 40 parts by mass of methyl lactate was added dropwise over 3 hours, and the whole was stirred at 90° C. for 3 hours. The solution was further stirred at 120° C. for 1 hour and then cooled to room temperature.

Subsequently, 28 parts by mass of glycidyl methacrylate, 0.2 part by mass of p-methoxyphenol, and 43 parts by mass of propylene glycol monomethylether acetate were added and then stirred while being aerated. The temperature of the solution was increased to 80° C. and 0.7 part by mass of triphenyl phosphine was then added. After that, the solution was continuously stirred at 80° C. for 1 hour and furthermore at 110° C. for 8 hours, whereby a solution of a (meth)acrylate polymer P-8 (solid content: 40 mass %) was obtained.

The acid number and weight average molecular weight of P-8 were 78 mgKOH/g and 25,000, respectively, as a result of measurement conducted by the same methods as those of Production Example 1.

Production Example 9

Preparation of Alkali-Soluble (Meth)Acrylate Polymer P-9 Containing Maleimide Skeleton in Main Chain In a flask equipped with an agitating device, a cooling pipe, a gas conduit, a dropping funnel, and a thermometer, 60 parts by mass of propylene glycol monomethylether acetate and 60 parts by mass of methyl lactate were weighed and then stirred while a nitrogen gas was introduced therein. The temperature of the solution was increased to 90° C. Then, a mixture of 18 parts by mass of N-cyclohexyl maleimide, 79 parts by mass of benzyl methacrylate, 37 parts by mass of methacrylic acid, 2 parts by mass of 2,2'-azobis(isobutyronitrile), 40 parts by mass of propylene glycol monomethylether acetate, and 40 parts by mass of methyl lactate was added dropwise over 3 hours, and the whole was stirred at 90° C. for 3 hours. The solution was further stirred at 120° C. for 1 hour and then cooled to room temperature.

Subsequently, 28 parts by mass of glycidyl methacrylate, 0.2 part by mass of p-methoxyphenol, and 43 parts by mass of propylene glycol monomethylether acetate were added to the solution and then the whole was stirred while being aerated. The temperature of the solution was increased to 80° C. and 0.6 part by mass of triphenyl phosphine was then added. After that, the solution was continuously stirred at 80° C. for 1 hour and furthermore at 110° C. for 8 hours, whereby a solution of a (meth)acrylate polymer P-9 (solid content: 40 mass %) was obtained.

The acid number and weight average molecular weight of P-9 were 78 mgKOH/g and 25,000, respectively, as a result of measurement conducted by the same methods as those of Production Example 1.

Production Example 10

Preparation of Alkali-Soluble (Meth)Acrylate Polymer P-10 Containing Maleimide Skeleton in Main Chain In a flask equipped with an agitating device, a cooling pipe, a gas conduit, a dropping funnel, and a thermometer, 60 parts by mass of propylene glycol monomethylether acetate and 60 parts by mass of methyl lactate were weighed and then stirred while a nitrogen gas was introduced therein. The temperature of the solution was increased to 90° C. Then, a mixture of 18 parts by mass of N-cyclohexyl maleimide, 53 parts by mass of benzyl methacrylate, 37 parts by mass of methacrylic acid, 25 parts by mass of styrene, 2 parts by mass of 2,2'-azobis(isobutyronitrile), 40 parts by mass of propylene glycol monomethylether acetate, and 40 parts by mass of methyl lactate was added dropwise over 3 hours, and the whole was stirred at 90° C. for 3 hours. The solution was further stirred at 120° C. for 1 hour and then cooled to room temperature.

Subsequently, 19 parts by mass of glycidyl methacrylate, 0.2 part by mass of p-methoxyphenol, and 28 parts by mass of propylene glycol monomethylether acetate were added to the solution, and then the whole was stirred while being aerated. The temperature of the solution was increased to 80° C. and 0.6 part by mass of triphenyl phosphine was then added. After that, the solution was continuously stirred at 80° C. for 1 hour and furthermore at 110° C. for 8 hours, whereby a solution of a (meth)acrylate polymer P-10 (solid content: 40 mass %) was obtained.

The acid number and weight average molecular weight of P-10 were 108 mgKOH/g and 22,000, respectively, as a result of measurement conducted by the same methods as those of Production Example 1.

Production Example 11

Preparation of Alkali-Soluble (Meth)Acrylate Polymer P-11 Containing Maleimide Skeleton in Main Chain In a flask equipped with an agitating device, a cooling pipe, a gas conduit, a dropping funnel, and a thermometer, 96 parts by mass of propylene glycol monomethylether acetate and 24 parts by mass of methyl lactate were weighed and then stirred while a nitrogen gas was introduced therein. The temperature of the solution was increased to 90° C. Then, a mixture of 18 parts by mass of N-cyclohexyl maleimide, 69 parts by mass of 2-ethylhexyl methacrylate, 23 parts by mass of 2-hydroxyethyl methacrylate, 24 parts by mass of methacrylic acid, 2 parts by mass of 2,2'-azobis(isobutyronitrile), 64 parts by mass of propylene glycol monomethylether acetate, and 16 parts by mass of methyl lactate was added dropwise over 3 hours, and the whole was stirred at 90° C. for 3 hours. The solution was further stirred at 120° C. for 1 hour and then cooled to room temperature.

Subsequently, 19 parts by mass of glycidyl methacrylate, 0.2 part by mass of p-methoxyphenol, and 28 parts by mass of propylene glycol monomethylether acetate were added to the solution, and then the whole was stirred while being aerated. The temperature of the solution was increased to 80° C. and 0.6 part by mass of triphenyl phosphine was then added. After that, the solution was continuously stirred at 80° C. for 1 hour and furthermore at 110° C. for 8 hours, whereby a solution of a (meth)acrylate polymer P-11 (solid content: 40 mass %) was obtained.

The acid number and weight average molecular weight of P-11 were 54 mgKOH/g and 26,000, respectively, as a result of measurement conducted by the same methods as those of Production Example 1.

Production Example 12

Preparation of Alkali-Soluble (Meth)Acrylate Polymer P-12 Free of Maleimide Skeleton in Main Chain In a flask equipped with an agitating device, a cooling pipe, a gas conduit, a dropping funnel, and a thermometer, 60 parts by mass of propylene glycol monomethylether acetate and 60 parts by mass of methyl lactate were weighed and then stirred while a nitrogen gas was introduced therein. The temperature of the solution was increased to 90° C. Then, a mixture of 18 parts by mass of cyclohexyl methacrylate, 79 parts by mass of benzyl methacrylate, 37 parts by mass of methacrylic acid, 2 parts by mass of 2,2'-azobis(isobutyronitrile), 40 parts by mass of propylene glycol monomethylether acetate, and 40 parts by mass of methyl lactate was added dropwise over 3 hours, and the whole was stirred at 90° C. for 3 hours. The solution was further stirred at 120° C. for 1 hour and then cooled to room temperature.

Subsequently, 28 parts by mass of glycidyl methacrylate, 0.2 part by mass of p-methoxyphenol, and 43 parts by mass of propylene glycol monomethylether acetate were added to the solution, and then the whole was stirred while being aerated. The temperature of the solution was increased to 80° C. and 0.6 part by mass of triphenyl phosphine was then added. After that, the solution was continuously stirred at 80° C. for 1 hour and furthermore at 110° C. for 8 hours, whereby a solution of a (meth)acrylate polymer P-12 (solid content: 40 mass %) was obtained.

The acid number and weight average molecular weight of P-12 were 78 mgKOH/g and 27,000, respectively, as a result of measurement conducted by the same methods as those of Production Example 1.

Production Example 13

Preparation of Alkali-Soluble (Meth)Acrylate Polymer P-13 Free of Maleimide Skeleton in Main Chain In a flask equipped with an agitating device, a cooling pipe, a gas conduit, a dropping funnel, and a thermometer, 96 parts by mass of propylene glycol monomethylether acetate and 24 parts by mass of methyl lactate were weighed and then stirred while a nitrogen gas was introduced therein. The temperature of the solution was increased to 90° C. Then, a mixture of 18 parts by mass of cyclohexyl methacrylate, 69 parts by mass of 2-ethylhexyl methacrylate, 23 parts by mass of 2-hydroxyethyl methacrylate, 24 parts by mass of methacrylic acid, 2 parts by mass of 2,2'-azobis(isobutyronitrile), 64 parts by mass of propylene glycol monomethylether acetate, and 16 parts by mass of methyl lactate was added dropwise over 3 hours, and the whole was stirred at 90° C. for 3 hours. The solution was further stirred at 120° C. for 1 hour and then cooled to room temperature.

Subsequently, 19 parts by mass of glycidyl methacrylate, 0.2 part by mass of p-methoxyphenol, and 28 parts by mass of propylene glycol monomethylether acetate were added to the solution, and then the whole was stirred while being aerated. The temperature of the solution was increased to 80° C. and 0.6 part by mass of triphenyl phosphine was then added. After that, the solution was continuously stirred at 80° C. for 1 hour and furthermore at 110° C. for 8 hours, whereby a solution of a (meth)acrylate polymer P-13 (solid content: 40 mass %) was obtained.

The acid number and weight average molecular weight of P-13 were 54 mgKOH/g and 25,000, respectively, as a result of measurement conducted by the same methods as those of Production Example 1.

Example 1

Preparation of Resin Varnish COV-1 for the Formation of Core Part

In a wide-mouthed polyethylene bottle, (A) 168 parts by mass (solid content: 60 parts by mass) of the above solution of P-1 (solid content: 36 mass %) as an alkali-soluble (meth) acrylate polymer having a maleimide skeleton in a main chain, (B) 20 parts by mass of ethoxylated bisphenol A diacrylate (A-BPE-6, manufactured by Shin-nakamura Chemical Corporation) and 20 parts by mass of p-cumylphenoxyethyl acrylate (A-CMP-1E, manufactured by Shin-nakamura Chemical Corporation) as polymerizable compounds, and (C) 1 part by mass of 1-[4-(2-hydroxyethoxy)phenyl]-2-hydroxy-2-methyl-1-propane-1-on (Irgacure 2959, manufactured by Ciba Specialty Chemicals) and 1 part by mass of bis(2,4,6-trimethylbenzoyl)phenylphosphineoxide (Irgacure 819, manufactured by Ciba Specialty Chemicals) as polymerization initiators were weighed and then stirred for 6 hours using a stirring device at a rotation speed of 400 rpm at a temperature of 25° C., whereby a resin vanish for the formation of a core part was prepared. After that, the resulting preparation was subjected to pressure filtration with a polyflon filter (PF020, manufactured by Advantec MFS, Inc.) with a pore size of 2 μm and a membrane filter (J050A, manufactured by Advantec MFS, Inc.) with a pore size of 0.5 μm at a temperature of 25° C. and a pressure of 0.4 MPa. Subsequently, the preparation was defoamed using a vacuum pump and a bell jar under reduced pressure for 15 minutes at a reduced pressure of 50 mmHg, whereby a resin varnish COV-1 for the formation of a core part was obtained.

[Preparation of Resin Film COF-1 for the Formation of Core Part]

The above resin varnish COV-1 for the formation of a core part was applied onto the untreated surface of a PET film (A1517 of 16 μm in thickness, manufactured by Toyobo Co., Ltd.) with a coater (Multicoater TM-MC, manufactured by Hirano Tecseed Co., Ltd.), dried at 100° C. for 20 minutes, and attached with a releasable PET film (A31 of 25 μm in thickness, manufactured by Teijin DuPont Films Japan Limited), whereby a resin film COF-1 for the formation of a core part was obtained. In this case, the thickness of the resin layer can be optionally adjusted by adjusting the gap of the coater. In this example, the thickness was adjusted so that the film thickness after the hardening could be 50 μm.

[Preparation of Resin Varnish CLV-1 for the Formation of Clad Layer]

In a wide-mouthed polyethylene bottle, 303 parts by mass (solid content: 50 parts by mass) of a solution of acrylic rubber (HTR-860P-3, manufactured by Nagase ChemteX Corporation) with a molecular weight of about 850,000 in methyl ethyl ketone (sold content: 17 mass %) as a binder polymer, (B) 50 parts by mass of alicyclic diepoxycarboxylate (KRM-2110, manufactured by Adeka Corporation) as a polymerizable compound, and (C) 4 parts by mass (solid content: 2 parts by mass) of a solution of triaryl sulfonium hexafluoroantimonate salt (SP-170, manufactured by Adeka Corporation) (solid content: 50 mass %) as a polymerization initiator were weighed and then stirred for 6 hours using a stirring device at a rotation speed of 400 rpm at a temperature of 25° C., whereby a resin vanish for the formation of a clad layer was prepared. After that, the resulting preparation was subjected to pressure filtration with a polyflon filter (PF060, manufactured by Advantec MFS, Inc.) with a pore size of 6 μm at a temperature of 25° C. and a pressure of 0.4 MPa. Subsequently, the preparation was defoamed using a vacuum pump and a bell jar under reduced pressure for 15 minutes at a reduced pressure of 50 mmHg, whereby a resin varnish CLV-1 for the formation of a clad layer was obtained.

[Preparation of Resin Film CLF-1 for the Formation of Clad Layer]

The above resin varnish CLV-1 for the formation of a clad layer was applied onto the untreated surface of a PET film (A1517 of 16 μm in thickness, manufactured by Toyobo Co., Ltd.) and then dried in a manner similar to that of the resin film for the formation of a core layer, whereby a resin film CLF-1 for the formation of a clad layer was obtained. In this case, the thickness of the resin layer can be optionally adjusted by adjusting the gap of the coater. In this example, the thickness was adjusted so that the film thickness after the hardening could be 30 μm for the resin film for the formation of a lower clad layer, 80 μm for the resin film for the formation of an upper clad layer, and 50 μm for the hardened film for the measurement of refractive index and transmissivity.

[Preparation of Hardened Film for the Measurement of Refractive Index and Transmissivity]

A UV ray (at a wavelength of 365 nm) at an intensity of 1,000 mJ/cm$^2$ was applied to the resin film for the formation of a core part and the resin film for the formation of a clad layer by using a UV exposure device (MAP-1200-L, manufactured by Dainippon Screen Mfg. Co., Ltd.). Subsequently, the protective film (A31) was removed and then the remainder was dried at 130° C. for 1 hour. After that, the base material film (A1517) was removed, whereby a hardened film with a thickness of 50 μm was obtained.

[Measurement of Refractive Index]

The refractive index of the obtained hardened film at a wavelength of 830 nm at a temperature of 25° C. was measured using a prism coupler (SPA-4000, manufactured by Sairon Technology, Co., Ltd.). The measured refractive index was 1.524.

[Measurement of Transmissivity]

The transmissivity of the obtained hardened film at a wavelength of 400 nm at a temperature of 25° C. was measured using a spectrophotometer (U-3410 spectrophotometer, manufactured by Hitachi Ltd.). The measured transmissivity was 87%.

[Preparation of Optical Waveguide]

The resin film CLF-1 for the formation of a lower clad layer from which the protective film (A31) had been removed was laminated on an FR-4 substrate (E-679FB, manufactured by Hitachi Chemical Co., Ltd.) using a roll laminator (HLM-1500, manufactured by Hitachi Plant Techno Co., Ltd.) under the conditions of a pressure of 0.4 MPa, a temperature of 80° C., and a rate of 0.4 m/min. Further, pressure-bonding was performed using a vacuum-pressure type laminator (MVLP-500/600, manufactured by Meiki Co., Ltd.) under the conditions of a pressure of 0.5 MPa, a temperature of 50° C., and a pressure time of 30 seconds.

Next, the base material film (A1517) was removed after the application of a UV ray (at a wavelength of 365 nm) at an intensity of 1,000 mJ/cm$^2$ by using a UV exposure device (MAP-1200-L, manufactured by Dainippon Screen Mfg. Co., Ltd.), and then the remainder was subjected to a heat treatment at 120° C. for 1 hour, whereby an under clad layer 4 was formed.

Subsequently, the resin film COF-1 for the formation of a core part from which the protective film (A31) had been removed was laminated on the lower clad layer 4 using the above roll laminator under the conditions of a pressure of 0.4 MPa, a temperature of 80° C., and a rate of 0.4 m/min. Further, pressure-bonding was performed using the above vacuum-pressure type laminator under the conditions of a pressure of 0.5 MPa, a temperature of 50° C., and a pressure time of 30 seconds.

Subsequently, the resultant was irradiated with the UV ray (at a wavelength of 365 nm) at an intensity of 500 mJ/cm$^2$ by using the above exposure device through a photo mask (negative type) of 50 μm in width and then exposed at 80° C. for 5 minutes, followed by heating. The base material film (A1517) was removed and the core part 2 was then developed using a developer (2.38-mass % aqueous tetramethylammonium hydroxide solution). After that, the core part 2 was washed with pure filter and then dried by heating at 100° C. for 1 hour.

Subsequently, the resin film CLF-1 for the formation of an upper clad layer from which the protective film (A31) had been removed was laminated on the core part 2 and the lower clad layer 4 using the above vacuum-pressure type laminator under the conditions of a pressure of 0.5 MPa, a temperature of 50° C., and a pressure time of 30 seconds. The resultant was irradiated with the UV ray (at a wavelength of 365 nm) at an intensity of 2,000 mJ/cm$^2$, and the base material film (A1517) was removed. After that, the remainder was subjected to a heat treatment at 120° C. for 1 hour. As a result, an upper clad layer 3 was formed and an optical waveguide having a substrate 5 as shown in FIG. 1(a) was obtained. Subsequently, the optical waveguide was cut into pieces of 5 cm in waveguide length using a dicing saw (DAD-341, manufactured by DISCO Inc.).

[Measurement of Optical Transmission Loss]

The optical transmission loss of each cutout optical waveguide was 0.18 dB/cm as a result of measurement by a cutback method (measured waveguide lengths of 5, 3, and 2 cm) using a VCSEL (FLS-300-01-VCL, manufactured by EXFO Co, Ltd.) (light at a wavelength of 850 nm as a center wavelength) as alight source, a light-receiving sensor (Q82214, manufactured by Advantest Corporation), a light-incidence fiber (GI-50/125 multi-mode fiber, NA=0.20), and an light-output fiber (SI-114/125, NA=0.22).

[Reflow Test]

Figure 2:
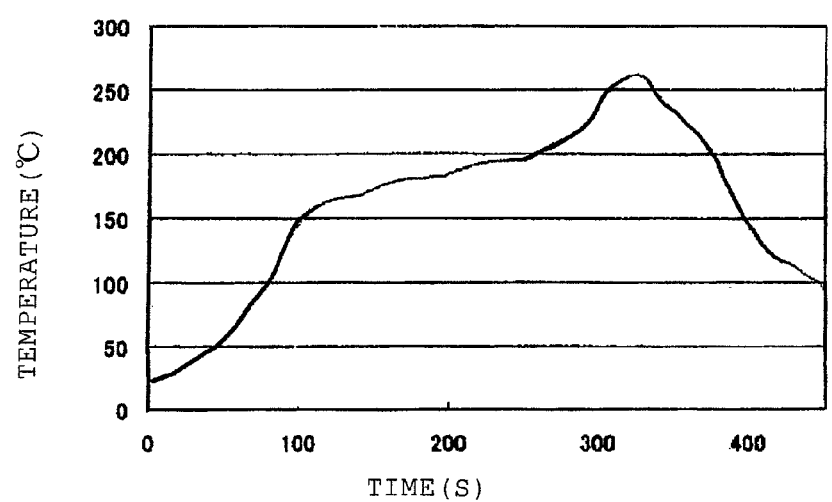
FIG. 2 is a graphic representation of a temperature profile in a reflow furnace in a reflow test carried out in the present invention.

A cutout optical waveguide (a waveguide length of 5 cm) was subjected to a reflow test three times using a reflow tester (Salamander XNA-645PC, manufactured by Furukawa electric Co., Ltd.) at a maximum temperature of 265° C. under the conditions based on IPC/JEDEC J-STD-020B. The detailed reflow conditions are listed in Table 1, and the temperature profile in the reflow furnace is represented in FIG. 2.

TABLE 1

| Zone No. | 1 | 2 | 3 | 4 | 5 | 6 | 7 |
|---|---|---|---|---|---|---|---|
| Upper heater preset temperature (° C.) | 175 | 195 | 220 | 250 | 280 | 220 | 0 |
| Lower heater preset temperature (° C.) | 175 | 195 | 220 | 250 | 300 | 240 | — |
| Conveyer speed (cm/min) | | | | 60 | | | |

The insertion loss of a flexible optical waveguide after the reflow test was 0.28 dB/cm as a result of measurement using the same light source, light-receiving device, incidence fiber, and output fiber as those described above.

Examples 2 to 10 and Comparative Example 1

Resin varnishes for the formation of a core part, COV-2 to 9, were prepared according to the respective blending ratios shown in Table 2. Likewise, resin varnishes for the formation of a clad layer, CLV-2 to 8, were prepared according to the respective blending ratios shown in Table 3. In a manner similar to Example 1, resin films for the formation of a core part, COF-2 to 9, and resin films for the formation of a clad layer, CLF-2 to 8, were prepared and optical waveguides 1 were then prepared, respectively. Table 4 shows each combination of the resin film for the formation of a core part and the resin film for the formation of a clad layer used in the production of the optical waveguide 1. In addition, Table 5 shows the results of the measurement of: the refractive index and transmissivity of the obtained hardened film; and the transmission losses of the optical waveguide 1 before and after the reflow test.

TABLE 2

| Item | Mixed component | COV-1 | COV-2 | COV-3 | COV-4 | COV-5 |
|---|---|---|---|---|---|---|
| (A) (Meth)acrylate polymer (part by mass) | P-1 solution*[1] (solid content: 36 mass %) | 168 (solid content 60) | — | — | — | — |
| | P-3 solution*[2] (solid content: 40 mass %) | — | 150 (solid content 60) | — | — | — |
| | P-4 solution*[3] (solid content: 40 mass %) | — | — | 150 (solid content 60) | — | — |
| | P-6 solution*[4] (solid content: 40 mass %) | — | — | — | 150 (solid content 60) | — |
| | P-7 solution*[5] (solid content: 40 mass %) | — | — | — | — | 150 (solid content 60) |
| | P-8 solution*[6] (solid content: 40 mass %) | — | — | — | — | — |
| | P-9 solution*[7] (solid content: 40 mass %) | — | — | — | — | — |
| | P-10 solution*[8] (solid content: 40 mass %) | — | — | — | — | — |
| | P-12 solution*[9] (solid content: 40 mass %) | — | — | — | — | — |
| (B) Polymerizable compound (part by mass) | A-8PE-6*[10] | 20 | 20 | 20 | — | 20 |
| | EA-0500*[11] | — | — | — | 20 | — |
| | A-CMP-1E*[12] | 20 | 20 | 20 | 20 | — |
| | A-401P*[13] | — | — | — | — | 20 |
| (C) Polymerization initiator (part by mass) | Irgacure 2959*[14] | 1 | 1 | 1 | 1 | 1 |
| | Irgacure I-819*[15] | 1 | 1 | 1 | 1 | 1 |
| Resin film for the formation of core part | | COF-1 | COF-2 | COF-3 | COF-4 | COF-5 |

| Item | Mixed component | COV-6 | COV-7 | COV-8 | COV-9 |
|---|---|---|---|---|---|
| (A) (Meth)acrylate polymer (part by mass) | P-1 solution*[1] (solid content: 36 mass %) | — | — | — | — |
| | P-3 solution*[2] (solid content: 40 mass %) | — | — | — | — |
| | P-4 solution*[3] (solid content: 40 mass %) | — | — | — | — |
| | P-6 solution*[4] (solid content: 40 mass %) | — | — | — | — |
| | P-7 solution*[5] (solid content: 40 mass %) | — | — | — | — |
| | P-8 solution*[6] (solid content: 40 mass %) | 150 (solid content 60) | — | — | — |
| | P-9 solution*[7] (solid content: 40 mass %) | — | 150 (solid content 60) | — | — |
| | P-10 solution*[8] (solid content: 40 mass %) | — | — | 150 (solid content 60) | — |
| | P-12 solution*[9] (solid content: 40 mass %) | — | — | — | 150 (solid content 60) |

TABLE 2-continued

|  |  |  |  |  |  |  |
|---|---|---|---|---|---|---|
| (B) Polymerizable compound (part by mass) | A-8PE-6*[10] | 20 | 20 | 20 | 20 |
|  | EA-0500*[11] | — | — | — | — |
|  | A-CMP-1E*[12] | — | 20 | 20 | — |
|  | A-401P*[13] | 20 | — | — | 20 |
| (C) Polymerization initiator (part by mass) | Irgacure 2959*[14] | 1 | 1 | 1 | 1 |
|  | Irgacure I-819*[15] | 1 | 1 | 1 | 1 |
| Resin film for the formation of core part |  | COF-6 | COF-7 | COF-8 | COF-9 |

*[1](Meth)acrylate polymer solution produced in Production Example 1
*[2](Meth)acrylate polymer solution produced in Production Example 3
*[3](Meth)acrylate polymer solution produced in Production Example 4
*[4](Meth)acrylate polymer solution produced in Production Example 6
*[5](Meth)acrylate polymer solution produced in Production Example 7
*[6](Meth)acrylate polymer solution produced in Production Example 8
*[7](Meth)acrylate polymer solution produced in Production Example 9
*[8](Meth)acrylate polymer solution produced in Production Example 10
*[9](Meth)acrylate polymer solution produced in Production Example 12
*[10]Ethoxylated bisphenol A diacrylate (manufactured by Shin-nakamura Chemical Corporation)
*[11]Ethoxylated fluorene-type diacrylate (manufactured by Osaka Gas Chemicals Co., Ltd.)
*[12]p-cumylphenoxyethyl acrylate (manufactured by Shin-nakamura Chemical Corporation)
*[13]2-hydroxy-3-(o-phenylphenoxy)propylacrylate (manufactured by Shin-nakamura Chemical Corporation)
*[14]1-[4-(2-hydroxyethoxy)phenyl]-2-hydroxy-2-methyl-1-propane-1-one (manufactured by Ciba Specialty Chemicals)
*[15]Bis(2,4,6-trimethylbenzoyl)phenylphosphineoxide (manufactured by Ciba Specialty Chemicals)

TABLE 3

| Item | Mixed component |  | CLV-1 | CLV-2 | CLV-3 | CLV-4 |
|---|---|---|---|---|---|---|
| (A) (Meth)acrylate polymer (part by mass) | P-2 solution*[1] | (solid content: 36 mass %) | — | 150 (Solid content 60) | — | — |
|  | P-4 solution*[2] | (solid content: 40 mass %) | — | — | 150 (Solid content 60) | 150 (Solid content 60) |
|  | P-5 solution*[3] | (solid content: 40 mass %) | — | — | — | — |
|  | P-11 solution*[4] | (solid content: 40 mass %) | — | — | — | — |
|  | P-13 solution*[5] | (solid content: 40 mass %) | — | — | — | — |
| (B) Polymerizable compound (part by mass) | A-9300*[6] |  | — | 20 | 20 | — |
|  | EA-5420*[7] |  | — | 20 | — | 20 |
|  | A-CHD-4E*[8] |  | — | — | 20 | 20 |
|  | M-215*[9] |  | — | — | — | — |
|  | KRM-2110*[10] |  | 50 | — | — | — |
| (C) Polymerization initiator (part by mass) | Irgacure 2959*[11] |  | — | 1 | 1 | 1 |
|  | Irgacure 819*[12] |  | — | 1 | 1 | 1 |
|  | SP-170*[13] solution | (solid content: 50 mass %) | 4 (Solid content 2) | — | — | — |
| (D) Other (part by mass) | HTR-860-3P*[14] solution | (solid content: 17 mass %) | 303 (Solid content 50) | — | — | — |
| Resin film for the formation of clad layer |  |  | CLF-1 | CLF-2 | CLF-3 | CLF-4 |

| Item | Mixed component |  | CLV-5 | CLV-6 | CLV-7 | CLV-8 |
|---|---|---|---|---|---|---|
| (A) (Meth)acrylate polymer (part by mass) | P-2 solution*[1] | (solid content: 36 mass %) | — | — | — | — |
|  | P-4 solution*[2] | (solid content: 40 mass %) | — | — | — | — |
|  | P-5 solution*[3] | (solid content: 40 mass %) | 150 (Solid content 60) | — | — | — |
|  | P-11 solution*[4] | (solid content: 40 mass %) | — | 150 (Solid content 60) | 150 (Solid content 60) | — |
|  | P-13 solution*[5] | (solid content: 40 mass %) | — | — | — | 150 (Solid content 60) |

TABLE 3-continued

| (B) Polymerizable compound (part by mass) | A-9300*6 | 20 | 20 | 20 | 20 |
|---|---|---|---|---|---|
| | EA-5420*7 | — | — | — | — |
| | A-CHD-4E*8 | 20 | 20 | — | 20 |
| | M-215*9 | — | — | 20 | — |
| | KRM-2110*10 | — | — | — | — |
| (C) Polymerization initiator (part by mass) | Irgacure 2959*11 | 1 | 1 | 1 | 1 |
| | Irgacure 819*12 | 1 | 1 | 1 | 1 |
| | SP-170*13 solution (solid content: 50 mass %) | — | — | — | — |
| (D) Other (part by mass) | HTR-860-3P*14 solution (solid content: 17 mass %) | — | — | — | — |
| Resin film for the formation of clad layer | | CLF-5 | CLF-6 | CLF-7 | CLF-8 |

*1 (Meth)acrylate polymer solution produced in Production Example 2
*2 (Meth)acrylate polymer solution produced in Production Example 4
*3 (Meth)acrylate polymer solution produced in Production Example 5
*4 (Meth)acrylate polymer solution produced in Production Example 11
*5 (Meth)acrylate polymer solution produced in Production Example 13
*6 Ethoxylated isocyanuric acid triacrylate (manufactured by Shin-nakamura Chemical Corporation)
*7 Hydrogenated bisphenol A-type epoxyacrylate (manufactured by Shin-nakamura Chemical Corporation)
*8 Ethoxylated cyclohexane dimethanol diacrylate (manufactured by Shin-nakamura Chemical Corporation)
*9 Ethoxylated isocyanuric acid diacrylate (manufactured by TOAGOSEI CO., LTD.)
*10 Alicyclic diepoxycarboxylate (manufactured by Adeka Corporation)
*11 1-[4-(2-hydroxyethoxy)phenyl]-2-hydroxy-2-methyl-1-propane-1-one (manufactured by Ciba Specialty Chemicals)
*12 Bis(2,4,6-trimethylbenzoyl)phenylphosphineoxide (manufactured by Ciba Specialty Chemicals)
*13 Triarylsulfoniumhexafluoroantimonatesalt (manufactured by Adeka Corporation)
*14 Acrylic rubber (manufactured by Nagase ChemteX Corporation.)

TABLE 4

| Item | Example 1 | Example 2 | Example 3 | Example 4 | Example 5 | Example 6 |
|---|---|---|---|---|---|---|
| Resin film for the formation of lower clad layer | CLF-1 | CLF-2 | CLF-3 | CLF-4 | CLF-3 | CLF-5 |
| Resin film for the formation of core part | COF-1 | COF-2 | COF-3 | COF-3 | COF-4 | COF-5 |
| Resin film for the formation of upper clad layer | CLF-1 | CLF-2 | CLF-3 | CLF-4 | CLF-3 | CLF-5 |

| Item | Example 7 | Example 8 | Example 9 | Example 10 | Comparative Example 1 |
|---|---|---|---|---|---|
| Resin film for the formation of lower clad layer | CLF-6 | CLF-7 | CLF-1 | CLF-7 | CLF-8 |
| Resin film for the formation of core part | COF-6 | COF-7 | COF-7 | COF-8 | COF-9 |
| Resin film for the formation of upper clad layer | CLF-6 | CLF-7 | CLF-1 | CLF-7 | CLF-8 |

TABLE 5

| | Item | Example 1 | Example 2 | Example 3 | Example 4 | Example 5 | Example 6 |
|---|---|---|---|---|---|---|---|
| Resin film for the formation of core part | Film | COF-1 | COF-2 | COF-3 | COF-3 | COF-4 | COF-5 |
| | Reflective index*1 | 1.524 | 1.525 | 1.527 | 1.527 | 1.541 | 1.535 |
| | Transmissivity (%)*2 | 87 | 86 | 87 | 87 | 83 | 86 |
| Resin film for the formation of clad layer | Film | CLF-1 | CLF-2 | CLF-3 | CLF-4 | CLF-3 | CLF-5 |
| | Reflective index*1 | 1.496 | 1.507 | 1.509 | 1.506 | 1.509 | 1.510 |
| | Transmissivity (%)*2 | 63 | 90 | 91 | 89 | 91 | 90 |
| Optical waveguide | Initial transmission loss (dB/cm) | 0.18 | 0.12 | 0.12 | 0.11 | 0.19 | 0.15 |

TABLE 5-continued

|  |  |  |  |  |  |  |
|---|---|---|---|---|---|---|
| Transmission loss after performance of reflow test three times (dB/cm) | 0.28 | 0.24 | 0.20 | 0.21 | 0.26 | 0.23 |

| Item | | Example 7 | Example 8 | Example 9 | Example 10 | Comparative Example 1 |
|---|---|---|---|---|---|---|
| Resin film for the formation of core part | Film | COF-6 | COF-7 | COF-7 | COF-8 | COF-9 |
| | Reflective index*1 | 1.540 | 1.539 | 1.539 | 1.546 | 1.538 |
| | Transmissivity (%)*2 | 86 | 87 | 87 | 83 | 87 |
| Resin film for the formation of clad layer | Film | CLF-6 | CLF-7 | CLF-1 | CLF-7 | CLF-8 |
| | Reflective index*1 | 1.505 | 1.506 | 1.496 | 1.506 | 1.504 |
| | Transmissivity (%)*2 | 91 | 90 | 63 | 90 | 90 |
| Optical waveguide | Initial transmission loss (dB/cm) | 0.14 | 0.12 | 0.13 | 0.16 | 0.14 |
| | Transmission loss after performance of reflow test three times (dB/cm) | 0.23 | 0.19 | 0.24 | 0.21 | 0.35 |

*1 a wavelength of 830 nm, 25° C., and a film thickness of 50 μm
*2 a wavelength of 400 nm, 25° C., and a film thickness of 50 μm

The invention claimed is:

1. A method for preparing an optical waveguide, which comprises the steps of:

(1) providing a resin composition for an optical material comprising (A) at least one of an alkali-soluble acrylate polymer and an alkali-soluble methacrylate polymer, each containing a maleimide skeleton in a main chain, (B) a polymerizable compound, and (C) a polymerization initiator;

(2) forming with the resin composition at least one layer of a lower clad layer, a core part, and an upper clad layer; and (3) developing the above-formed layer with an aqueous alkaline solution.

2. The method for preparing an optical waveguide according to claim 1, wherein the main chains of (A) the alkali-soluble acrylate polymer and the alkali-soluble methacrylate polymer include repeating units (A-1) and (A-2) represented respectively by the following general formulae (1) and (2) and at least one of repeating units (A-3) and (A-4) represented respectively by the following general formulae (3) and (4):

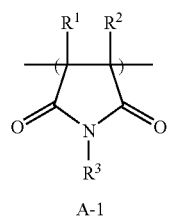

A-1 where $R^1$ to $R^3$ each independently represent any of a hydrogen atom and an organic group having 1 to 20 carbon atoms;

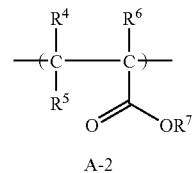

A-2 where $R^4$ to $R^6$ each independently represent any of a hydrogen atom and an organic group having 1 to 20 carbon atoms, and $R^7$ represents an organic group having 1 to 20 carbon atoms;

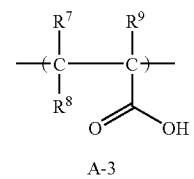

A-3 where $R^7$ to $R^9$ each independently represent any of a hydrogen atom and an organic group having 1 to 20 carbon atoms;

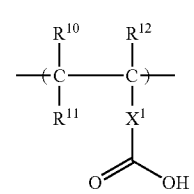

A-4 where $R^{10}$ to $R^{12}$ and $X^1$ each independently represent any of a hydrogen atom and an organic group having 1 to 20 carbon atoms.

3. The method for preparing an optical waveguide according to claim 1, wherein (B) the polymerizable compound comprises at least one of compounds represented by the following general formulae (5) to (8):

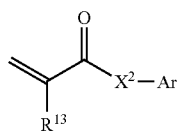   (5)

where:
Ar represents any of the following groups;

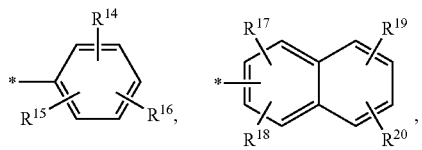

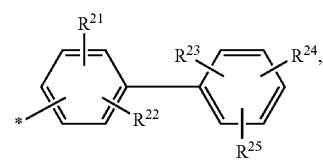

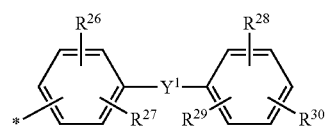

$X^2$ represents any of divalent groups of an oxygen atom (O), a sulfur atom (S), $OCH_2$, $SCH_2$, $O(CH_2CH_2O)_a$, $O[CH_2CH(CH_3)O]_b$, and $OCH_2CH(OH)CH_2O$;
$Y^1$ represents any of the following divalent groups;

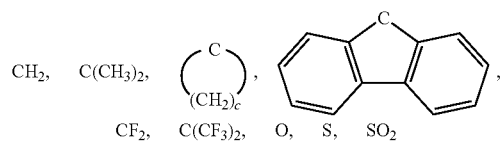

$R^{13}$ represents any of a hydrogen atom and a methyl group;
$R^{14}$ to $R^{30}$ each independently represent any of a hydrogen atom, a fluorine atom, an organic group having 1 to 20 carbon atoms, and a fluorine-containing organic group having 1 to 20 carbon atoms; and
a and b each independently represent an integer of 1 to 20, and c represents an integer of 2 to 10;

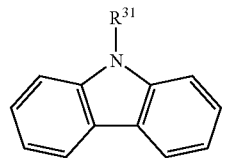   (6)

where:
$R^{31}$ represents any of the following groups;

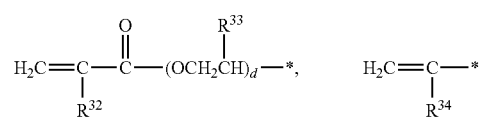

$R^{32}$ to $R^{34}$ each independently represent any of a hydrogen atom and a methyl group; and
d represents an integer of 1 to 10;

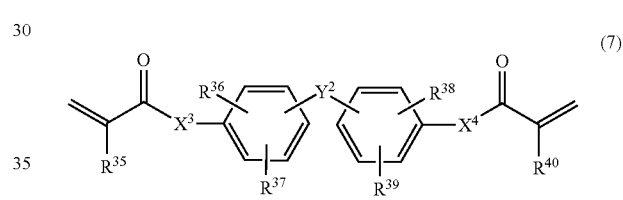   (7)

where:
$X^3$ and $X^4$ each independently represent any of divalent groups of O, S, $O(CH_2CH_2O)_e$, and $O[CH_2CH(CH_3)O]_f$;
$Y^2$ represents any of the following divalent groups;

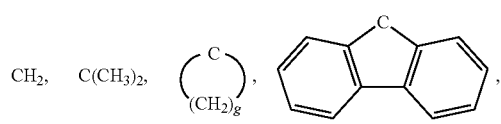

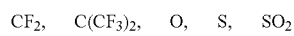

$R^{35}$ and $R^{40}$ each independently represent any of a hydrogen atom and a methyl group;
$R^{36}$ to $R^{39}$ each independently represent any of a hydrogen atom, a fluorine atom, an organic group having 1 to 20 carbon atoms, and a fluorine-containing organic group having 1 to 20 carbon atoms; and
e and f each independently represent an integer of 1 to 20, and g represents an integer of 2 to 10;

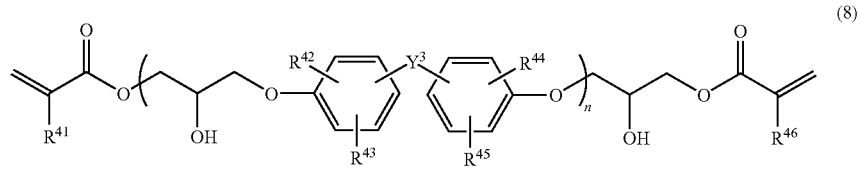

where:

Y³ represents any of the following divalent groups;

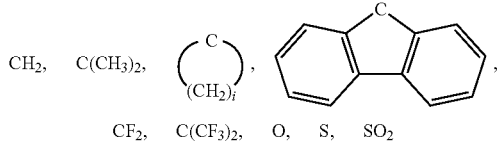

R⁴¹ and R⁴⁶ each independently represent any of a hydrogen atom and a methyl group;

R⁴² to R⁴⁵ each independently represent any of a hydrogen atom, a fluorine atom, an organic group having 1 to 20 carbon atoms, and a fluorine-containing organic group having 1 to 20 carbon atoms; and h represents an integer of 1 to 5, and i represents an integer of 2 to 10.

4. The method for preparing an optical wave guide according to claim 1, wherein a core part is formed of the resin composition.

* * * * *